United States Patent
Tang et al.

(10) Patent No.: US 10,706,185 B2
(45) Date of Patent: Jul. 7, 2020

(54) SYSTEMS AND METHODS FOR AUTOMATED SPATIAL CHANGE DETECTION AND CONTROL OF BUILDINGS AND CONSTRUCTION SITES USING THREE-DIMENSIONAL LASER SCANNING DATA

(71) Applicant: ARIZONA BOARD OF REGENTS ON BEHALF OF ARIZONA STATE UNIVERSITY, Tempe, AZ (US)

(72) Inventors: Pingbo Tang, Tempe, AZ (US); Vamsi Kalasapudi, Tempe, AZ (US)

(73) Assignee: Arizona Board of Regents on Behalf of Arizona State University, Tempe, AZ (US)

( * ) Notice: Subject to any disclaimer, the term of this patent is extended or adjusted under 35 U.S.C. 154(b) by 606 days.

(21) Appl. No.: 15/497,787

(22) Filed: Apr. 26, 2017

(65) Prior Publication Data

US 2017/0337299 A1    Nov. 23, 2017

Related U.S. Application Data

(60) Provisional application No. 62/327,930, filed on Apr. 26, 2016.

(51) Int. Cl.
*G06F 30/13* (2020.01)
*G06Q 50/08* (2012.01)
*G06F 30/18* (2020.01)
*G01C 15/00* (2006.01)
*G06Q 10/06* (2012.01)
*G06F 16/901* (2019.01)

(52) U.S. Cl.
CPC .............. *G06F 30/13* (2020.01); *G06F 30/18* (2020.01); *G06Q 50/08* (2013.01); *E02D 2600/10* (2013.01); *G01C 15/002* (2013.01); *G06F 16/9024* (2019.01); *G06Q 10/06* (2013.01)

(58) Field of Classification Search
CPC .... G06F 17/5004; G06F 17/509; G06F 17/50; G06F 16/9024; G06F 30/13; G06F 30/18; G06Q 50/08; G06Q 10/06; E02D 2600/10; G01C 15/002
USPC .......................................................... 703/1
See application file for complete search history.

(56) References Cited

PUBLICATIONS

Gordon, Chris et al. "Technology and Process Assessment of Using LADAR and Embedded Sensing for Construction Quality Control", 2005, Construction Research Congress, ASCE. (Year: 2005) (Year: 2005) (Year: 2005).*

Kalasapudi, Vamsi Sai et al. "Toward Automated Spatial Change Analysis of MeEPComponents using 3D Point Clouds and As-Designed BIM Models", 2014, Second International Conference on 3D Vision, IEEE. (Year: 2014) (Year: 2014) (Year: 2014).*

Tang, Pingbo et al. "A Spatial-Context-Based Approach for Automated Spatial Change Analysis of Piece-Wise Linear Building Elements", 2016, Computer-Aided Civil and Infrastructure Engineering 31. (Year: 2016) (Year: 2016) (Year: 2016).*

(Continued)

*Primary Examiner* — Cedric Johnson
(74) *Attorney, Agent, or Firm* — Polsinelli PC

(57) ABSTRACT

Systems and methods for automated spatial change detection and control of buildings and construction sites using three-dimensional laser scanning data are disclosed.

18 Claims, 11 Drawing Sheets
(9 of 11 Drawing Sheet(s) Filed in Color)

(56) References Cited

PUBLICATIONS

Tang, Pingbo et al. "A Spatial-Context-Based Approach for Automated Spatial Change Analysis of Piece-Wise Linear Building Elements", 2007, Sixth International Conference on 3-D Digital Imaging and Modeling, IEEE. (Year: 2007) (Year: 2007) (Year: 2007 ).*

Tang, Pingbo et al. "A Spatial-Context-Based Framework for Automated Spatial Change Analysis of Curvilinear Building Elements", 2014. (Year: 2014) (Year: 2014) (Year: 2014).*

Tang, Pingbo et al. "Automated Spatial Change Analysis of Building Systems using 3D Imagery Data", Oct. 9-12, 2013, Proceedings of the 30th CIB W78 International Conference. (Year: 2013) (Year: 2013) (Year: 2013).*

Tang, Pingbo et al. "Simulation for Characterizing a Progressive Registration Algorithm Aligning As-Built 3D Point Clouds Against As-Designed Models", 2013, Proceedings of the 2013 Winter Simulation Conference, IEEE. (Year: 2013).*

Kalasapudi, V., "Automatic Change-based Diagnosis of Structures Using Spatiotemporal Data and As-Designed Model", Arizona State University, PhD Dissertation, published on Proquest Jun. 2017 [retrieved Nov. 27, 2019], 199 pages, retrieved from the internet: <https://search-proquest-com.ezproxy1.lib.asu.edu/docview/1906289505/abstract/B116F18336194FE6PQ/1?accountid=4485>.

Park, J-H. et al., "Autonomous smart sensor nodes for global and local damage detection of prestressed concrete bridges based on accelerations and impedance measurements", Smart Structures and Systems, Jul. 2010, vol. 6, No. 5-6, pp. 711-730 <DOI:10.12989/sss.2010.6.5_6.711>.

Patjawit, A. et al., "Health monitoring of highway bridges based on a Global Flexibility Index", Engineering Structures, Aug. 2005 (available online May 2005), vol. 27, No. 9, pp. 1385-1391 <DOI:10.1016/j.engstruct.2005.04.003>.

Paul, N. et al., "Geometrical and topological approaches in building information modelling", Journal of Information Technology in Construction, Oct. 2009, vol. 14, pp. 705-723.

Poreba, M. et al., "A Robust Linear Feature-Based Procedure for Automated Registration of Point Clouds", Sensors, Jan. 2015, vol. 15, No. 1, pp. 1435-1457 <DOI:10.3390/s150101435>.

Raghavendrachar, M. et al., "Flexibility by Multireference Impact Testing for Bridge Diagnostics", Journal of Structural Engineering, Aug. 1992, vol. 118, No. 8, pp. 2186-2203 <DOI:10.1061/(ASCE)0733-9445(1992)118:8 (2186)>.

Riveiro, B. et al., "Terrestrial laser scanning and limit analysis of masonry arch bridges", Construction and Building Materials, Apr. 2011 (available online Dec. 2010), vol. 25, No. 4, pp. 1726-1735 <DOI:10.1016/j.conbuildmat.2010.11.094>.

Chen, L-C. et al., "Change Detection of Building Models from Aerial Images and Lidar Data", Technical Commission VII Symposium (Vienna, Austria, Jul. 5-7, 2010), 2010, vol. 38, Part 7B, pp. 121-126, retrieved from the internet: <URL:https://www.isprs.org/proceedings/XXXVIII/part7/b/pdf/121 _XXXVIII-part7B.pdf>.

Cosser, E. et al., "Measuring the Dynamic Deformation of Bridges Using a Total Station", Proceedings of the 11th FIG Symposium on Deformation Measurements (Santorini, Greece, May 25-28, 2003), 2003, 8 pages.

Cross, E. et al., "Long-term monitoring and data analysis of the Tamar Bridge", Mechanical Systems and Signal Processing, Feb. 2013 (available online Sep. 2012), vol. 35, No. 1-2, pp. 16-34 <DOI:10.1016/j.ymssp.2012.08.026>.

Kim, C. et al., "Modal parameter identification of short span bridges under a moving vehicle by means of multivariate AR model", Structure and Infrastructure Engineering, 2012 (available online Dec. 2010), vol. 8, No. 5, pp. 459-472 <D0OI:10.1080/15732479.2010.539061>.

Mabsout, M. et al., "Finite-Element Analysis of Steel Girder Highway Bridges", Journal of Bridge Engineering, Aug. 1997, vol. 2, No. 3, pp. 83-87 <DOI:10.1061/(ASCE)1084-0702(1997)2:3(83)>.

Sanjosé, J. et al., "Evaluation of structural damages from 3D Laser Scans", XXI International CIPS Symposium Comission V (Athens, Greece, Oct. 1-6, 2007), 2007, 6 pages.

Tessler, S. et al., "Qualitative Structural Analysis Using Diagrammatic Reasoning", The Seventh International Workshop on Qualitative Reasoning about Physical Systems (Orcas Island, WA, May 16-19, 1993), 1993, pp. 885-891.

Nfichter, et al., (2003), Semantic scene analysis of scanned 3D indoor environments. VMV 2003, Munich, Germany.

Nguyen, et al., (2005). Algorithms for automated deduction of topological information. Automation in Construction.14 (1), 59-70.*

Okom, et al., Toward automated modeling of floor plans, Proceedings of 3D Data Processing, Visualization and Transmission (3DPVT). (2010).

Oraskari, Change Detection in BIM Models—Computing Diffs Between Versions. 2014.

Osman, et al., (2011). Knowledge-enabled decision support system for routing of urban utilities. Journal of Construction Engineering and Management, ASCE. 137(3), 198-213.

Park, et al., (2007). A new approach for health monitoring of structures: terrestrial laser scanning. Computer-Aided Civil and Infrastructure Engineering. 22(1), 19-30.

Park, et al., Dynamic change management for construction: Introducing the change cycle into model-based project management, System Dynamics Review. 19 (2003) 213-242.

Parvan, et al., Estimating the impact factor of undiscovered design errors on construction quality, in: Proceedings of the 30th International Conference of the System Dynamics Society, 2012: pp. 1-16.

Paul, et al., (2009). Geometrical and topological approaches in building information modelling. Journal of Information Technology in Construction. 14 (Oct.). 705-23.

Pepiot-Desjardins, et al., An efficient error-propagation-based reduction method for large chemical kinetic mechanisms, Combust. Flame. 154 (2008) 67-81.

Poullis, et al., (2010). Delineation and geometric modeling of road networks. ISPRS Journal of Photogrammetry and Remote Sensing, 65(2), 165-81.

Pradhan, An Approach for Fusing Data from Multiple Sources to Support Construction Productivity Analyses. Carnegie Mellon University, Aug. 2009.

Pradhan, et al., Formalisms for query capture and data source identification to support data fusion for construction productivity monitoring, Automation in Construction. (2010).

Rabbani, et al., Segmentation of point clouds using smoothness constraint, International Archives of Photogrammetry, Remote Sensing and Spatial Information Sciences—Commission V Symposium "Image Engineering and Vision Metrology." 36 (2006).

Rodriguez, Common Causes for a Change Order—Common reasons why a change order is being requested. About.com 2012. [Online] Available: http://construction.about.com/od/Claims-Management/a/Common-Causes-For-A-Change-Order.htm.

Rojas, et al., (2009). Evaluating alternative methods for capturing as-built data for existing facilities, in Proceedings of the 2009 ASCE International Workshop on Computing in Civil Engineering, C. H. Caldas and W. J. O'Brien (eds.). ASCE, Austin, TX.

Schwarz, Estimating the dimension of a model, The Annals of Statistics. (1978) 461-464.

Shi, et al., (2000). Normalized cuts and image segmentation. IEEE Transactions on Pattern Analysis and Machine Intelligence, 22(8), 888-905.

Son, et al., (2013). Fully automated as-built 3D pipeline segmentation based on curvature computation from laser-scanned data, in L. Soibelman (ed.). Computing in Civil Engineering, AsSCE, Los Angeles, C, pp. 765-72.

Son, et al., 3D reconstruction of as-built industrial instrumentation models from laser-scan data and a 3D CAD database based on prior knowledge, Automation in Construction. 49 (2015) 193-200.

Stone, et al., (2004). Performance Analysts of Next-Generation LA DA R for Manufacturing, Construction, and Mobility, National Institute of Standards and Technology (NIST) Report No. NISTIR 7117, Gaithersburg, MD.

Sun, et al., Managing Changes in Construction Projects, EPSRC Industrial Report. (2004).

(56) References Cited

PUBLICATIONS

Suzuki, et al., Linear-time connected-component labeling based on sequential local operations. Computer Vision and Image Understanding, 89(1), 1-23. 2003.

Swart, et al., Refined Non-rigid Registration of a Panoramic Image Sequence to a LiDAR Point Cloud, in: Lecture Notes Computer Science, 2011: pp. 73-84.

Taneja, et al., "Sensing and field data capture for construction and facility operations", J. of Construction Engineering and Management. 2011.

Tang, et al., (2008). "Automated Measurement Extraction from Laser Scanned Point Clouds to Support Bridge Inspection." International Association for Bridge and Structural Engineering, Symposium 2008, Helsinki, Finland.

Tang, et al., "Characterization of Laser Scanners and Algorithms for Detecting Flatness Defects on Concrete Surfaces," Journal of Computing in Civil Engineering, vol. 25, No. 1, pp. 31-42, Jan./Feb. 2011.

Tang, et al., Efficient and Effective Quality Assessment of As-Is Building Information Models and 3D Laser-Scanned Data: In Proceedings of the ASCE International Workshop an Computing in Civil Engineering, pp. 486-493. Jun. 2011.

Tang, et al., "Formalization of Workflows for Extracting Bridge Surveying Goals from Laser-Scanned Data", Automation in Construction (in press).

Tang, et al., A Comparative Analysis of Depth-Discontinuity and Mixed-Pixel Detection Algorithms, in: Sixth International Conference on 3-D Digital Imaging and Modeling (3DIM 2007), Montreal, Canada, IEEE, 2007: pp. 29-38.

Tang, et al., A Spatial-Context-Based Approach for Automated Spatial Change Analysis of Piece-Wise Linear Building Elements, Computer-Aided Civil and Infrastructure Engineering. 31 (2015) 65-80.

Tang, et al., Automated Spatial Change Analysis of Building Systems Using 3D Imagery Data, in: 30th CIB W78 International Conference—Oct. 9-12, 2013, Beijing, China, Proceedings of the 30th CIB W78 International Conference, 2013: pp. 252-261. http://itc.scix.net/data/works/att/w78-2013-paper-86.pdf.

Tang, et al., Automatic reconstruction of as-built building information models from laser-scanned point clouds: A review of related techniques, Automation in Construction. 19 (Nov. 2010) 829-843.

Tang, et al., Simulation for characterizing a progressive registration algorithm aligning as-built 3D point clouds against as-designed models, in: 2013 Winter Simulations Conference (WSC), IEEE, 2013: pp. 3169-3180.

Technodigit, 3DReshaper (Home) | About Technodigit | Contact, (2009). http://www.3dreshapencom/en/software-en/contact-en/about-technodigit (accessed Feb. 9, 2017).

Teizer, et al., Real-time three-dimensional occupancy grid modeling for the detection and tracking of construction resources, Journal of Construction Engineering and Management. 133 (2007) 880.

Van Goor, B., "Change detection and deformation analysis using Terrestrial Laser Scanning: Case study of the metro tunnel at Rotterdam central station", Delft University of Technology, Master Thesis, Feb. 2011 [retrieved Nov. 7, 2019], 150 pages, retrieved from the internet: <URL:https://repository.tudelft.nl/islandora/object/uuid:acd7e4f7-849b-400f-a5bb-29bb485d427a?collection=education>.

Gentle, J. E. (2007). Matrix Algebra: theory, computations, and applications in statistics. Books.Google.Com.

Luhmann, T., Robson, S., Kyle, S., and Boehm, J. (2013). Close-Range Photogrammetry and 3D Imaging. Close-Range Photogrammetry and 3D Imaging.

Abu-Yosef, A., "Development of Non-Contact Passive Wireless Sensors for Detection of Corrosion in Reinforced Concrete Bridge Decks", The University of Texas at Austin, Dec. 2013 [retrieved Nov. 6, 2019], 358 pages, retrieved from the internet: <https://repositories.lib.utexas.edu/handle/2152/23303>.

Adeli, H. et al., "Dynamic Fuzzy Wavelet Neural Network Model for Structural System Identification", Journal of Structural Engineering, Jan. 2006, vol. 132, No. 1, pp. 102-111.

Agdas, D. et al., "Comparison of Visual Inspection and Structural-Health Monitoring As Bridge Condition Assessment Methods", Journal of Performance of Constructed Facilites, Jun. 2016, vol. 30, No. 3, article 04015049, 10 pAGES <DOI:10.1061/(ASCE)CF.1943-5509.0000802>.

Aghagholizadeh, M. et al., "A Review of Model Updating Methods for Civil Infrastructure Systems" in: Computational Techniques for Civil and Stuctural Engineering, Saxe-Coburg Publications (Stirlingshire, UK), 2015, Chapter 4, pp. 83-99 <DOI:10.4203/csets.38.4>.

Antova, G., "Registration Process of Laser Scan Data in the Field of Deformation Monitoring", Procedia Earth and Planetary Science, Sep. 2015, vol. 15, pp. 549-552 <DOI:10.1016/j.proeps.2015.08.096>.

Armesto, J. et al., "Modelling masonry arches shape using terrestrial laser scanning data and nonparametric methods", Engineering Structures, Feb. 2010 (available online Nov. 2009), vol. 32, No. 2, pp. 607-615 <DOI:10.1016/j.engstruct.2009.11.007>.

ASCE., "2013 Report Card for America's Infrastructure", 2013 Report Card for America's Infrastructure Advisory of ASCE, 2013, 74 pages <DOI:10.1061/9780784478837>.

ASCE., "Failure to act: the economic impact of current investment trends in water and wastewater treatment infrastructure", ASCE: American Society of Civil Engineers, 2011, 52 pages <DOI:10.1061/9780784478813>.

Autodesk., "Overview: Project Review Software for AEC Professionals" [online], Navisworks, Aug. 2014 [retrieved on Nov. 21, 2019 from archive.org, as it appeared on Aug. 7, 2014], retrieved from the internet: <URL:https://web.archive.org/web/20140807024848/https://www.autodesk.com/products/navisworks/overview>.

Azhar, S. et al., "Building Information Modeling (BIM): A New Paradigm for Visual Interactive Modeling and Simulation for Construction Projects", First International Conference on Construction in Developing Countries (Karachi, Pakistan, Aug. 4-5, 2008), 2008, 10 pages.

Banan, M. et al., "Parameter Estimation of Structures from Static Response. I. Computational Aspects", Journal of Structural Engineering, Nov. 1994, vol. 120, No. 11, pp. 3243-3258 <DOI:10.1061/(ASCE)0733-9445(1994) 120:11(3243)>.

Barnea, S. et al., "Keypoint based autonomous registration of terrestrial laser point-clouds", ISPRS Journal of Photogrammetry and Remote Sensing, Jan. 2008 (available online Jul. 2007), vol. 63, No. 1, pp. 19-35 <DOI:10.1016/j.isprsjprs.2007.05.005>.

Basharat, A. et al., "A Framework for Intelligent Sensor Network with Video Camera for Structural Health Monitoring of Bridges", IEEE International Conference on Pervasive Computing and Communications Workshops (Kauai Island, HI, Mar. 8-12, 2005), 2005, pp. 385-389 <DOI:10.1109/Percomw.2005.6>.

Beskhyroun, S. et al., "New methodology for the application of vibration-based damage detection techniques", Structural Control Health Monitoring, Dec. 2012 (available online May 2011), vol. 19, No. 8, pp. 632-649 <DOI:10.1002/stc.456>.

Besl, P. et al., "A method for registration of 3-D shapes", IEEE Transactions on Pattern Analysis and Machine Intelligence, Feb. 1992, vol. 14, No. 2, pp. 239-256 <DOI:10.1109/34.121791>.

Borrmann, A. et al., "Specification and implementation of directional operators in a 3D spatial query language for building information models", Advanced Engineering Informatics, Jan. 2009 (available online Aug. 2008), vol. 23, No. 1, pp. 32-44 <DOI:10.1016/j.aei.2008.06.005>.

Bosche, F. et al., "Automated Recognition of 3D CAD Objects in Site Laser Scans for Project 3D Status Visualization and Performance Control", Journal of Computing in Civil Engineering, Nov. 2009, vol. 23, No. 6, pp. 311-318 <DOI:10.1061/(ASCE)0887-3801(2009)23:6(311)>.

Byfield, M. et al., "Murrah Building Collapse: Reassessment of the Transfer Girder", Journal of Performance of Constructed Facilities, Jul./Aug. 2012, vol. 26, No. 4, pp. 371-376 <DOI:10.1061/(asce)cf.1943-5509.0000227>.

(56) References Cited

PUBLICATIONS

Cabaleiro, M. et al., "Algorithm for beam deformation modeling from LiDAR data", Measurement, Dec. 2015 (available online Aug. 2015), vol. 76, pp. 20-31 <DOI:10.1016/j.measurement.2015.08.023>.

Cabaleiro, M. et al., "Automatic 3D modelling of metal frame connections from LiDAR data for structural engineering purposes", ISPRS Journal of Photogrammetry and Remote Sensing, Oct. 2014 (available online Jul. 2014), vol. 96, pp. 47-56 <DOI:10.1016/j.isprsjprs.2014.07.006>.

Caetano, E. et al., "Ambient Vibration Test and Finite Element Correlation of the New Hintze Ribeiro Bridge", 21st IMAC Conference & Exposition (Kissimee, FL, Feb. 3-6, 2003), 2003, 7 pages.

Chang, P. et al., "Review Paper: Health Monitoring of Civil Infrastructure", Structural Health Monitoring, Sep. 2003, vol. 2, No. 3, pp. 257-267 <DOI:10.1177/1475921703036169>.

Chen, J. et al., "Modal identification of simple structures with high-speed video using motion magnification", Journal of Sound and Vibration, Jun. 2015 (available online Mar. 2015), vol. 345, pp. 58-71 <DOI:10.1016/j.jsv.2015.01.024>.

Boukamp, Modeling of and reasoning about construction specifications to support automated defect detection, Carnegie Mellon University, 2006.

Clarkson, Nearest-neighbor searching and metric space dimensions, Nearest-Neighbor Methods for Learning and Vision: Theory and Practice. (2006) 15-59.

ClearEdge 3D, EdgeWise Plant Suite | ClearEdge 3D, (2011). http://www.clearedge3d.com/products/edgewise-plant-suite/ (accessed Mar. 12, 2015).

CloudCompare—open source project. OpenSource Project. Available at: http:/Avvnv.danielgm.net/cci. accessed Nov. 9, 2011.

Efroymson, Multiple regression analysis, in: A. Ralston, H. Wilf (Eds.), Mathematical Methods for Digital Computers. Wiley: New York, 1960: pp. 191-203.

Ergan, et al., An Automated Approach for Developing Integrated Model-Based Project Histories to Support Estimation of Activity Production Rates, Journal of Computing in Civil Engineering. 1 (2012) 95.

Felzenszwalb, et al., (2004). Efficient graph-based image segmentation. International Journal of Computer Vision, 59 (2). 16741.

Feng, et al., Modeling the Effect of Rework Timing: Case Study of a Mechanical Contractor, Proceedings of the 16th Annual Conference of the International Group for Lean Construction. Manchester, United Kingdom, Jul. 16-18, 2008, 691-701.

Frome, et al., Recognizing objects in range data using regional point descriptors, Computer Vision—ECCV 2004. (2004) 224-237.

Fuchs, et al., (2004), Applications of laser-based instrumentation for highway bridges. Journal of Bridge Engineering, ASCE, 9(6). 541-49.

Geosystems, "Leica Cyclone 5.4 Technical Specifications." product literature, (2006).

Girardeau-Montaut, et al., Change detection on points cloud data acquired with a ground laser scanner, International Archives of Photogrammetry. Remote Sensing and Spatial Information Sciences, 36(part 3), W19. (2005) http://www.danielgm.net/phd/isprs_laserscanning_2005_dgm.pdf.

Golovinskiy, et al., (2009). Min-cut based segmentation of point clouds, in Computer Vision Workshops (ICCV Workshops), 2009 IEEE 12th International Conference on, IEEE. 39-46, 2009.

Golparvar-fard, et al., Monitoring of Construction Performance Using Daily Progress Photograph Logs and 4D As-planned Models William E . O'Neil Pre-Doctoral Candidate in Construction Management and Master of Computer Science Student, University of Illinois, Urbana-Champaign, No. 2009, pp. 53-63, 2009.

Gómez-Garcia-Bermejo, et al., (2013). Automated registration of 3D scans using geometric features and normalized color data, Computer-Aided Civil and Infrastructure Engineering, 28(2), 98-111.

Gordon, et al., Assessment of visualization software for support of construction site inspection tasks using data collected from reality capture technologies, in: Proceedings of the International Conference on Computing in Civil Engineering, ASCE, 2005.

Gordon, et al., Technology and process assessment of using LADAR and embedded sensing for construction quality control, in: Construction Research Congress 2005, San Diego, CA, United states, ASCE. 2005.

Gordon, et al., Formalism for construction inspection planning: Requirements and process concept, Journal of Computing in Civil. (2007).

Gordon, et al., Automated planning support for on-site construction inspection, Automation in Construction. (2008).

Gordon, et al., "Characterization and Search of Construction Inspection Plan Spaces Developed Using a Component-Based Planning Approach." Journal of Computing in Civil Engineering, vol. 23. Issue 4, pp. 211-220. 2009.

Gorte, et al., Structuring laser-scanned trees using 3D mathematical morphology, International Archives of Photogrammetry and Remote Sensing. 35 (2004) 929-933.

Gschwandtner, et al., BlenSor: Blender sensor simulation toolbox in Advances in Visual Computing, Lecture Notes in Computer Science. Springer. Berlin, Heidelberg, 199-208. 2011.

Han, et al., Identification and Quantification of Non-Value-Adding Effort from Errors and Changes in Design and Construction Projects, Journal of Construction Engineering and Management (138) 98-109. Jan. 2012.

Hao, W. Shen, J. Neelamkavil, Il Thomas. Change Management in Construction Projects, in: CIB W78 International Conference on Information Technology in Construction, 2008: pp. 1-11.

Fruchter, R. et al., "QStruc: an approach for qualitative structural analysis", Computing Systems in Engineering, Apr.-Jun. 1993 (available online Jul. 2003), vol. 4, No. 2-3, pp. 147-157 <DOI:10.1016/0956-0521(93)90040-4>.

Guo, H. et al., "Fiber Optic Sensors for Structural Health Monitoring of Air Platforms", Sensors, Mar. 2011, vol. 11, No. 4, pp. 3687-3705 <DOI:10.3390/s110403687>.

Hobbs, B. et al., "Non-destructive testing techniques for the forensic engineering investigation of reinforced concrete buildings", Forensic Science International, Apr. 2007 (available online Aug. 2006), vol. 167, No. 2-3, pp. 167-172 <DOI:10.1016/j.forsciint.2006.06.065>.

Hsiao, K. et al., "Change detection of landslide terrains using ground-based LiDAR data", XXth ISPRS Congress Comission VII (Istanbul, Turkey, Jul. 12-23, 2004), 2004, 5 pages, retrieved from the internet: <URL:https://pdfs.semanticscholar.org/2d54/a7bab58939bb776b07b569a043687cd6aa89.pdf?_ga=2.216880342.1192782722.1573147447-864597407.1550179162>.

Kalasapudi, V. et al., "Condition Diagnostics of Steel Water Tanks Using Correlated Visual Pattern", 5th International/ 11th Construction Specialty Conference (Vancouver, BC, Jun. 8-10, 2015), 2015, vol. 195, 8 pages.

Kim, Y. et al., "System Identification of High Impact Resistant Structures", 12th International Work Conference on Artificial Neural Networks (Puerto de la Cruz, Spain, Jun. 12-14, 2013), 2013, pp. 169-178 <DOI:10.1007/978-3-642-38679-4_16>.

Koh, B. et al., "Structural health monitoring for flexible bridge structures using correlation and sensitivity of modal data", Computers & Structures, Feb. 2007 (available online Nov. 2006), vol. 85, No. 3-4, pp. 117-130 <DOI:10.1016/j.compstruc.2006.09.005>.

Kovacic, B. et al., "Processing of Signals Produced by Strain Gauges in Testing Measurements of the Bridges", Procedia Engineering, Sep. 2015, pp. 795-801 <DOI:10.1016/j.proeng.2015.08.249>.

Lattanzi, D. et al., "Robust Automated Concrete Damage Detection Algorithms for Field Applications", Journal of Comupting in Civil Engineering, Mar./Apr. 2014, vol. 28, No. 2, pp. 253-262 <DOI:10.1061/(ASCE) CP.1943-5487.0000257>.

Lee, H. et al., "Stress Estimation of Beam Structures Based on 3D Coordinate Information from Terrestrial Laser Scanning", 3rd International Conference on Control, Automation and Systems Engineering (Auckland, New Zealand, Aug. 28-29, 2013), 2013, pp. 81-83 <DOI:10.2991/case-13.2013.20>.

(56) References Cited

PUBLICATIONS

Lindenbergh, R. et al., "A statistical deformation analysis of two epochs of terrestrial laser data of a lock", Proceedings of Optical 3-D Measurement Techniques VII (Vienna, Austria, Oct. 3-5, 2005), Jan. 2005, pp. 61-70.

Liter, J., "The contribution of qualitative and quantitative shape features to object recognition across changes of view", Memory & Cognition, Sep. 1998, vol. 26, No. 5, pp. 1056-1067 <DOI:10.3758/BF03201183>.

Lovett, A. et al., "Shape is like Space: Modeling Shape Representation as a Set of Qualitative Spatial Relations", AAAI Spring Symposium Series: Cognitive Shape Processing (Palo Alto, CA, Mar. 22-24, 2010), 2010, pp. 21-27.

Malek, A. et al., "Prediction of Failure Load of R/C Beams Strengthened with FRP Plate Due to Stress Concentration at the Plate End", Structural Journal, Mar.-Apr. 1998, vol. 95, No. 2, pp. 142-152.

Maragakis, E. et al., "Analytical models for the rigid body motions of skew bridges", Mathematical and Computer Modelling, 1989 (available online Mar. 2002), vol. 12, No. 3, pp. 377 <DOI:10.1016/0895-7177(89)90115-5>.

Monserrat, O. et al., "Deformation measurement using terrestrial laser scanning data and least squares 3D surface matching", ISPRS Journal of Photogrammetry and Remote Sensing, Jan. 2008 (available online Sep. 2007), vol. 63, No. 1, pp. 142-154 <DOI:10.1016/j.isprsjprs.2007.07.008>.

Mosalam, K. et al., "Applications of laser scanning to structures in laboratory tests and field surveys", Structural Control & Health Monitoring, Jan. 2014 (available online Mar. 2013), vol. 21, No. 1, pp. 115-134 <DOI:10.1002/stc.1565>.

Moschas, F. et al., "Measurement of the dynamic displacements and of the modal frequencies of a short-span pedestrian bridge using GPS and an accelerometer", Engineering Structures, Jan. 2011 (available online Oct. 2010), vol. 33, No. 1, pp. 10-17 <DOI:10.1016/j.engstruct.2010.09.013>.

Museros, L. et al., "A Qualitative Theory for Shape Representation and Matching", Proceedings of the 18th International Workshop on Qualitative Reasoning (Evanston, IL, Aug. 2-4, 2004), 2004, 8 pages.

Noma, E., "Using Principal Components Analysis to determine the best fitting plane from locations in a #PointCloud" [online], Garrett Asset Management: New York Tech Journal, Sep. 2015 [retrieved on Nov. 7, 2019], retrieved from the internet: <URL:https://elliotnoma.wordpress.com/2015/09/29/using-principal-components-analysis-to-determine-the-best-fitting-plane-from-locations-in-a-point-cloud/>.

Olsen, M. et al., "Terrestrial Laser Scanning-Based Structural Damage Assessment", Journal of Computing in Civil Engineering, May/Jun. 2010 (available online May 2009), vol. 24, No. 3, pp. 264-272 <DOI:10.1061/(ASCE) CP.1943-5487.0000028>.

Green, M. et al., "Dynamic Response of Highway Bridges to Heavy Vehicle Loads: Theory and Experimental Validation", Journal of Sound and Vibration, Feb. 1994 (available online May 2002), vol. 170, No. 1, pp. 51-78 <DOI:10.1006/jsvi.1994.1046>.

Riveiro, B. et al., "Validation of terrestrial laser scanning and photogrammetry techniques for the measurement of vertical underclearance and beam geometry in structural inspection of bridges", Measurement, Jan. 2013 (available online Oct. 2012), vol. 46, No. 1, pp. 784-794 <DOI:10.1016/j.measurement.2012.09.018>.

Stephen, G. et al., "Measurements of static and dynamic displacement from visual monitoring of the Humber Bridge", Engineering Structures, 1993 (available online Mar. 2003), vol. 15, No. 3, pp. 197-208 <D01:10.1016/0141-0296(93) 90054-8>.

Su, Y. et al., "Integration of Construction As-Built Data Via Laser Scanning with Geotechnical Monitoring of Urban Excavation", Journal of Construction Engineering and Management, Dec. 2006, vol. 132, No. 12, pp. 1234-1241 <DOI:10.1061/(ASCE)0733-9364(2006)132:12(1234)>.

Vandapel, N. et al., "Natural terrain classification using 3-d ladar data", IEEE International Conference on Robotics and Automation (New Orleans, LA, Apr. 26-May 1, 2004), 2004, pp. 5117-5122 <DOI:10.1109/Robot.2004.1302529>.

Vezocnik, R. et al., "Use of Terrestrial Laser Scanning Technology for Long Term High Precision Deformation Monitoring", Sensors, Dec. 2009, vol. 9, No. 12, pp. 9873-9895 <DOI:10.3390/s91209873>.

Wakefield, R. et al., "Analysis of Seismic Failure in Skew Rc Bridge", Journal of Structural Engineering, Mar. 1991, vol. 117, No. 3, pp. 972-986 <DOI:10.1061/(ASCE)0733-9445(1991)117:3(972)>.

Wang, J. et al., "Integrating BIM and LiDAR for Real-Time Construction Quality Control", Journal of Intelligent & Robotic Systems, Aug. 2015 (available online Sep. 2014), vol. 79, No. 3-4, pp. 417-432 <DOI:10.1007/s10846-014-0116-8>.

Yi, T-H. et al., "Experimental assessment of high-rate GPS receivers for deformation monitoring of bridge", Measurement, Jan. 2013 (available Aug. 2012), vol. 46, No. 1, pp. 420-432 <DOI:10.1016/j.measurement.2012.07.018>.

Zeibak, R. et al., "Change detection via terrestrial laser scanning", ISPRS Workshop on Laser Scanning and SilviLaser (Espoo, Finland, Sep. 12-14, 2007), 2007, pp. 430-435.

Zhao, X. et al., "Bridge Displacement Monitoring Method Based on Laser Projection-Sensing Technology", Sensors, Apr. 2015, vol. 15, No. 4, pp. 8444-8463 <DOI:10.3390/s150408444>.

Zogg, H-M. et al., "Terrestrial Laser Scanning for Deformation Monitoring-Load Tests on the Felsenau Viaduct (CH)", The International Archives of the Photogrammetry, Remote Sensing and Spatial Information Sciences (Beijing), 2008, vol. 37, Part B5, pp. 555-562.

Gordon, A Formalism and a Framework for Planning of Sensor-Based Inspections on Construction Sites, Carnegie Mellon University, 2006.

Hindmarch, et al., A Proposed Construction Design Change Management Tool to Aid in Making Informed Design Decisions, 26th Annual Association of Researchers in Construction Management Conference. (2010) 21-29. http://www.arcom.ac.uk/publicationsfprocs/ar2010-0021-0029_Hindmarch Gale_and_Harrison.pdf (accessed Nov. 3, 2014).

Hofle, et al., (2007), Correction of laser scanning intensity data: data and model-driven approaches, ISPRS Journal of Photogrammenry and Remote Sensing. 62(6), 415-33.

Hoover, et al., (1996). An experimental comparison of range image segmentation algorithms. IEEE Transactions on Pattern Analysis and Machine Intelligence, 18(7). 673-89.

Huber, et al., (2004). Parts-based 3D object classification, in Proceedings of the 2004 IEEE Computer Society Conference on Computer Vision and Pattern Recognition, IEEE, 11-82.

Huber, et al., "As Is Laser Technology and Modeling," in Embedded Commissioning of Building Systems: Evaluating Buildings in the Information Age, Artech House, Inc., 2011.

Huber, et al., "Fully Automatic Registration of Multiple 3D Data Sets," Image and Vision Computing, vol. 21, No. 7, Jul. 2003, pp. 637-650.

Huber, et al., Using laser scanners for modeling and analysis in architecture, engineering, and construction, 2010 44th Annual Conference on Information Sciences and Systems (CISS). (2010) 1-6.

Hwang, et al., Measuring the impact of rework on construction cost performance. Journal of Construction Engineering and Management, ASCE, 135(3), 187-98. 2009.

InnovMetric | InnovMetric Software, (2000). http://www.innovmetric.com/en/about/about-innovmetric.

Jaselskis, et al., Pilot study on laser scanning technology for transportation projects, in: Proc. 2003 Mid-Continent Transp. Res. Symp. Ames, Iowa, 2003. http://www.ctre.iastate.edu/PUBS/midcon2003/jaselskislaser.pdf (accessed Oct. 29, 2014).

Johnson, et al., Using spin images for efficient object recognition in cluttered 3D scenes. Pattern Analysis and Machine Intelligence, IEEE Transactions on. 21 (1999) 433-449.

Josephson, Y. Hammarlund, The causes and costs of defects in construction: A study of seven building projects, Automation in Construction. 8 (1999) 681-687.

Kalasapudi, et al., Adaptive 3D Imaging and Tolerance Analysis of Prefabricated Components for Accelerated Construction, Proceed-

(56) References Cited

PUBLICATIONS ing of the 3rd International Conference on Sustainable, Design. Engineering and Construction (1CSDEC 2014). p. (in press), 2014.

Kalasapudi, et al., Automated Tolerance Analysis of Curvilinear Components Using 3D Point Clouds for Adaptive Construction Quality Control, in: Computing in Civil Engineering 2015, American Society of Civil Engineers, Reston, VA, 2015: pp. 57-65.

Kalasapudi, et al., Toward Automated Spatial Change Analysis of MEP Components Using 3D Point Clouds and As-Designed BIM Models, in: 2014 2nd International Conference on 3D Vision, IEEE, Dec. 8, 2014: pp. 145-152.

Kelly, et al., "Real-Time Photorealistic Visualized Reality Interface for Remote Mobile Robot Control," International Journal of Robotics Research, vol. 30, No. 3. pp. 384-404, Mar. 2011.

Dalgaard, Introductory statistics with R (2nd edition), Springer Verlag, 2008.

Forsyth and Ponce, (2002), Computer Vision: A Modern Approach, Prentice Hall Professional Technical Reference, Upper Saddle River, New Jersey.

Loáasz and Plummer, M. D. (2009). Matching Theory. American Mathematical Society. New York, 547.

The 3D scanner software for point cloud process, 3D modeling, reverse engineering and 3D quality control. [Online]. Available: http://www.3dreshaper.com/en1/En_software.htm. [Accessed: jUL. 13, 2015].

Adan, et al. Automatic Creation of Semantically Rich 3D Building Models from Laser Scanner Data, in: Proceedings of the International Symposium on Automation and Robotics in Construction (ISARC). Jun. 2011. Seoul, Korea/.

Adaán, et al., 3D Reconstruction of Interior Wall Surfaces Under Occlusion and Clutter, in Proceedings of 3D Imaging Modeling. Processing, Visualization and Transmission (3DIMPVT), Hangzhou, China, May 2011.

AIA Homepage —Te American Institute of Architects, (n. d.). http://www.aia.org/ (accessed Nov. 4, 2014).

Akaike, A new look at the statistical model identification, Automatic Control, IEEE Transactions. (1974) pp. 716-723.

Akcamete, et al., Motivation for Computational Support for Updating Building Information Models (BIMs), in: ASCE, 2009.

Akinci, et al., A Formalism for Utilization of Sensor Systems and Integrated Project Models for Active Construction Quality Control. Automation in Construction, vol. 15, Issue 2, Mar. 2006, pp. 124-138.

Akinci, et al., Representation and Integration of As-Built Information to IFC Based Product and Process Models for Automated Assessment of As-Built Conditions. Proceedings of 19th International Symposium on Automation and Robotics in Construction, ISARC, Washington, D.C., 2003. pp. 543-550.

Al-Hader, et al.,The smart city infrastructure development & monitoring. Theoretical and Empirical Researches in Urban Management, (2009). 4(2), 87-94.

Anil, et al., Assessment of Quality of As-is Building Information Models Generated from Point Clouds Using Deviation Analysis. in Proceedings of the SPIE vol. 7864A. Electronics Imaging Science and Technology Conference (IS&T), 3D Imaging Metrology, San Francisco, California, Jan. 2011.

Anil, et al., Deviation analysis method for the assessment of the quality of the as-is Building Information Models generated from point cloud data, Automation in Construction 35 (2013) 507-516.

Anselin, et al., GeoDa: An Introduction to Spatial Data Analysis. Geographical Analysis. 38 (2006) 5-22.

Anselin, Local Indicators of Spatial Association—LISA, Geographical Analysis. 27 (1995) 93-115.

Arayici (2008). Towards building information modeling for existing structures. Structural Survey, School of Built Environment, The University of Salford, Salford, United Kingdom, 26(3), 210-22.

Atasoy, et al., (2010), "Visualizing laser scanner data for bridge inspection". 2010 Proceedings of the 27th ISARC, Bratislava, Slovakia, pp. 390-399.

Autodesk Inc. navisworks. Available at: http//:usa.autodesk.com/adsk/servlet/pc/index?site ID=123112&id=10571060, accessed Feb. 12, 2010.

Autodesk, Project Review Software | Navisworks Family | Autodesk. [Online]. Available: http:/www.autodesk.com/products/navisworks/overview. [Accessed: Oct. 12, 2014].

Azhar, et al., Building Information Modeling (BIM ): A New Paradigm for Visual Interactive Modeling and Simulation for Construction Projects, in: First International Conference on Construction in Developing Countries (ICCODC-I), 2008: p. 435.

Bhatla, et al., Evaluation of accuracy of as-built 3D modeling from photos taken by handheld digital cameras, Autom. Constr., vol. 28, pp. 116-127, Dec. 2012.

Bosché, Automated recognition of 3D CAD model objects in laser scans and calculation of as-built dimensions for dimensional compliance control in construction, Advanced Engineering Informatics. 24 (2010) 107-118. Jan. 2010.

Bosché, et al., The value of integrating Scan-to-BIM and Scan-vs-BIM techniques for construction monitoring using laser scanning and BIM: The case of cylindrical MEP components, Automation in Construction. 49 (2015) 201-213.

Bosché, et al., Tracking the Built Status of MEP Works: Assessing the Value of a Scan-vs-BIM System, Journal of Computing in Civil Engineering. 28(4) 2014. 5014004.

Boukamp, Automated processing of construction specifications to support inspection and quality control, Automation in Construction. 2007.

Cai, et al., Modeling Road Centerlines and Predicting Lengths in 3-D Using LIDAR Point Cloud and Planimetric Road Centerline Data, Computer-Aided Civil and Infrastructure Engineering. 23 (2008) 157-173.

Cao, et al., Point cloud skeletons via Laplacian based contraction, in Shape Modeling International Conference, IEEE Society, 187-97. 2010.

Chi et al., A Methodology for Object Identification and Tracking in Construction Based on Spatial Modeling and Image Matching Techniques, Comput. Civ. Infrastruct. Eng., vol. 24, No. 3, pp. 199-211, Apr. 2009.

Cho, et al., Target-Focused Local Workspace Modeling for Construction Automation Applications, Journal of Computing in Civil Engineering. 1 (2011) 116.

Choi, et al., A Feature Based Approach to Automatic Change Detection from Lidar Data in Urban Areas, Laserscanning09, vol. XXXVIII, Paris, France, 259-64, 2006.

Khanzode, et a., Challenges and benefits of implementing virtual design and construction technologies for coordination of mechanical, electrical, and plumbing systems on large healthcare project, in: Proceedings of CIB 24th W78 Conference, 2007: pp. 205-212.

Khanzode, et al., Benefits and Lessons Learned of Implementing Building Virtual Design and Construction ( Vdc ) Technologies for Coordination of Mechanical, Electrical, and Plumbing ( Mep ) Systems on a Large Healthcare Project, Mar. pp. 1-19, 2008.

Kim, et al., Automated dimensional quality assessment of precast concrete panels using terrestrial laser scanning, Automation in Construction. 45 (2014) 163-177.

Kiziltas, et al., Automated Generation of Customized Field Data Collection Templates to Support Information Needs of Cost Estimators. Journal of Computing in Civil Engineering. 24 (2010) 129.

Kiziltas, et al., Comparison of experienced and novice cost estimator behaviors in information pull and push methods, Canadian Journal of Civil Engineering. 37 (2010) 290-301.

Kiziltas, et al., Contextual information requirements of cost estimators from past construction projects, Journal of Construction Engineering and Management 135 (2009) 841.

Kiziltas, et al., Field technologies and their impact on management of supply chains, in: Construction Supply Chain Management Handbook, Boca Raton, FL, CRC Press, 2008: pp. 16:1-28.

Kiziltas, et al., Technological assessment and process implications of field data capture technologies for construction and facility/infrastructure management, J. Inf. Technol. Constr., Special Issue on Sens. In Constr. Infrastruct. Man. 13 (2008) 134-154.

(56) References Cited

PUBLICATIONS

Koch, et al., An approach to distributed building modeling on the basis of versions and changes, Advanced Engineering Informatics. (2011).

Korman, et al., (2008). Using building information modeling to improve the mechanical, electrical, and plumbing coordination process for buildings, in Proceedings of the AEI. Sep. 24-27, 2008, Denver. CO.

Langroodi, et al., Change Management with Building Information Models: A Case Study, Construction Research Congress 2012. (2012) 1182-1191.

Lee, et al., Automated pipeline extraction for modeling from laserscanned data, Gerontechnology. 11 (2012).

Lee, et al., Quality and Change Management Model for Large Scale Concurrent Design and Construction Projects, J. Constr. Eng. Manag. 131 (2005) 890-902.

Lee, et al., Skeleton-based 3D reconstruction of as-built pipelines from laser-scan data, Automation in Construction. 35 (2013) 199-207.

Lee, System dynamics approach for error and change management in concurrent design and construction, Proceedings of the 37th Conference Conference on Winter. (2005).

Leica Cyclone—3D Point Cloud Processing Software—Leica Geosystems—HDS. [Online]. Available: http://hds.leica-geosystems. com/en/Leica-Cyclone_6515.htm. (Accessed: Jul. 13, 2015].

Liang-Chien, "Change Detection of Building Models from Aerial Images and Lidar Data," isprs.org, vol. XXXVIII, pp. 121-126, 2010.

Lindenbergh, et al., Change detection and deformation analysis using static and mobile laser scanning, Appl. Geomatics. 7 (2015) 65-74.

Liu, et al., (2012). Discriminative features for image classification and retrieval. Pattern Recognition Letters, 33(6), 744-51.

Love, et al., (2000). Quantifying the causes and costs of rework in construction. Construction Management & Economics, 18(4). 479-90.

Love, et al., Rework in civil infrastructure projects: determination of cost predictors. Journal of Construction Engineering and Management. 136(3)-—275-82. 2010.

Love, et al., Using systems dynamics to better understand change and rework in construction project management systems. International Journal of Project Management. 20 (2002) 425-436.

Malpica, et al., (2010). Urban changes with satellite imagery and LIDAR data. International Archives of the Photogrammetry, Remote Sensing and Spatial Information Science, Kyoto. Japan 2010, XXXVIII (Part 8).

Moreno, et al., (2013). An instrumented vehicle for efficient and accurate 3D mapping of roads. Computer-Aided Civil and Infrastructure Engineering. 28(6), 403-19.

Mrozowski, et al., Development of a Change Management Process for Use on Construction Projects at Michigan State University, 2004.

Nahangi, et al., Automated 3D compliance checking in pipe spool fabrication, in: Advanced Engineering Informatics, 2014: pp. 360-369.

Dassault Systemes., "Abaqus Unified FEA" [online], Dassault Systemes, Dec. 2014 [retrieved Nov. 21, 2019 from archive.org, as it appeared on Dec. 19, 2014], retrieved from the internet: <URL:https://web.archive.org/web/20141219022557/http://www.3ds.com:80/products-services/simulia/products/abaqus/>.

Deruyter, G. et al., "Risk Assessment: A Comparison between the Use of Laser Scanners and Total Stations in a Situation Where Time Is the Critical Factor", 13th SGEM GeoConference on Informatics, Geoinformatics and Remote Sensing (Albena, Bulgaria, Jun. 16-22, 2013), 2013, vol. 2, pp. 687-694 <DOI:10.5593/SGEM2013/BB2.V2/S10.019>.

Diederichs, R., "Bridge Testing" [online], Nondestructive Testing (NDT), Aug. 2007 [retrieved Nov. 11, 2007 from archive.org, as it appeared on Nov. 18, 2007], retrieved from the internet: <URL:https://web.archive.org/web/20071118185627/https://www.ndt.net/ndtaz/content.php?id=635>.

Erickson, M. et al., "The Accuracy of Photo-Based Three-Dimensional Scanning for Collision Reconstruction Using 123D Catch", SAE 2013 World Congress & Exhibition (Detroit, MI, Apr. 16-18, 2013), 2013, 10 pages <DOI:10.4271/2013-01-0784>.

Faro., "Scene: The most intuitive and efficient software for scan data processing and registration" [online], 2019 [retrieved Nov. 21, 2019 from faro.com], retrieved from the internet: <URL:https://www.faro.com/products/construction-bim/faro-scene/>.

Flynn, P. et al., "CAD-based computer vision: from CAD models to relational graphs", IEEE Transactions on Pattern Analysis and Machine Intelligence, Feb. 1991, vol. 13, No. 2, pp. 114-132 <DOI:10.1109/34.67642>.

Frohlich, C. et al., "Terrestrial laser scanning—new perspectives in 3D surveying", International Archives of Photogrammetry, Remote Sensing and Spatial Information Sciences, 2004, pp. 7-13.

Garner, M., "Analyzed a Simple Truss by the Method of Joints" [online], 2015 [retrieved on Nov. 7, 2019 from archive.org, as it appeared on Apr. 29, 2017], retrieved from the internet: <URL:https://web.archive.org/web/20170429201624/https://www.instructables.com/id/Analyzing-a-Simple-Truss-by-the-Method-of-Joints/>.

Gokce, H. et al., "Structural Identification for Performance Prediction Considering Uncertainties: Case Study of a Movable Bridge", Journal of Structural Engineering, Oct. 2013, vol. 139, No. 10, pp. 1703-1715 <DOI:10.1061/(ASCE)ST.1943-541X.0000601>.

Gvili, R., "Iterative Closest Point" [online], Powerpoint Presentation [retrieved Nov. 27, 2019 from archive.org, as it appeared on Mar. 3, 2006], retrieved from the internet: <URL:https://web.archive.org/web/20060303080057/www.cs.tau.ac.il/—dcor/Graphics/adv-slides/ICP.ppt>.

Tekla. [Online]. Available: http://www.tekla.com/us. [Accessed: Oct. 12, 2014].

Tekla. http://www.tekla.com/products/tekla-structures. 2014.

Torma, et al., Distributed Transactional Building Information Management. Building Information Management, Proceedings of the First International Workshop on Linked Data in Architecture and Construction (LDAC 2012).

Torma, Semantic Linking of Building Information Models. 2013 IEEE Seventh International Conference on Semantic Computing, pp. 412-419.

Turkan, et al., Automated progress tracking using 4D schedule and 3D sensing technologies, Automation in cconstruction. 22 (2012) 414-421.

Turkan, et al., Toward automated earned value tracking using 3D imaging tools, J. Constr . . . , vol. 139, No. 4. pp. 423-433, 2012.

Turkan, et al., (2010). Towards automated progress tracking of erection of concrete structures, in Sixth International Conference on Innovation in Architecture, Engineering and Construction (AEC), University Park, PA.

U.S. Department of Commerce, Construction Spending, U.S. Census Bureau News. (2011) 1.

Valero, et al., Automatic construction of 3D basic-semantic models of inhabited interiors using laser scanners and RFID sensors, Sensors (Basel), vol. 12. No. 5, pp. 5705-24, Jan. 2012.

VRMesh—3D point cloud and mesh processing software. (Online]. Available: http://www.vrmesh.com/. [Accessed: Jul. 13, 2015].

Walsh, et al., (2013). Data processing of point clouds for object detection for structural engineering applications. Computer-Aided Civil and Infrastructure Engineering. 28(7). 495-08.

Wang, et al. Integrating BIM and LiDAR for Real-Time Construction Quality Control. Journal of Intelligent & Robotic Systems. 79 (2015) 417-432.

Xie, et al., Current situation of natural disaster in electric power system and countermeasures. Journal of Natural Disasters, (2006). 15(4). 126-31.

Xiong, et al., "Using Context to Create Semantic 3D Models of Indoor Environments," Proceedings of the British Machine Vision Conference (BMVC), Aberystwyth. UK. Sep. 2010.

Xiong, et al., Automatic creation of semantically rich 3D building models from laser scanner data, Automation in Construction. 31 (2013) 325-337.

(56) References Cited

PUBLICATIONS

Yang et al., RANSAC Matching: Simultaneous Registration and Segmentation, 2010 ieee International Conference on Robotics and Automation, Anchorage Convention District, May 3-8, 2010, Anchorage, Alaska, USA.

Yue, et al., The ASDMCon project: The challenge of detecting defects on construction sites, in: 3D Data Processing, Visualization, and Transmission, Third International Symposium on, IEEE, 2006: pp. 1048-1055.

Zeibak-Shini, et al., (2012). Toward generation of a Building Information Model of a deformed structure using laser scanning technology, in KCCCBE 2012. Moscow, Russia. http://www.icccbe.ru/paper_long/0350paper_long.pdf (accessed Oct. 8, 2014).

Zhao, et al., (2005). A new Hausdorff distance for image matching. Pattern Recognition Letters, 26(5), 581-86.

Patil, N. et al., "Non Destructive Testing (NDT) Advantages and Limitations", SRES College of Engineering, Aug. 2008, pp. 71-78.

Solari, G., "Mathematical Model to Predict 3—D Wind Loading on Buildings", Journal of Engineering Mechanics, Jan. 1985, vol. 111, No. 2, pp. 254-276 <DOI:10.1061/(ASCE)0733-9399(1985)111:2(254)>.

Son, H. et al., "Automated Schedule Updates Using As-Built Data and a 4D Building Information Model", Journal of Management in Engineering, Jul. 2017 (available online Mar. 2017), vol. 33, No. 4, article 04017012, 13 pages <DOI:10.1061/(ASCE)ME.1943-5479.0000528>.

Wahbeh, A. et al., "A vision-based approach for the direct measurement of displacements in vibrating systems", Smart Materials and Structures, Sep. 2003, vol. 12, No. 5, pp. 785-794 <DOI:10.1088/0964-1726/12/5/016>.

\* cited by examiner

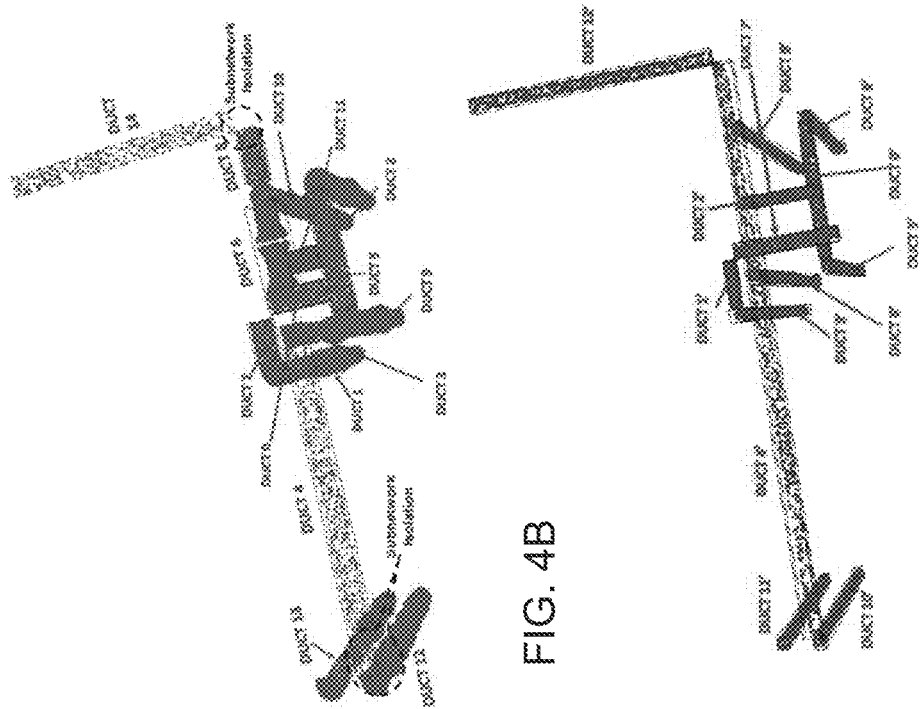
FIG. 4B
FIG. 4C
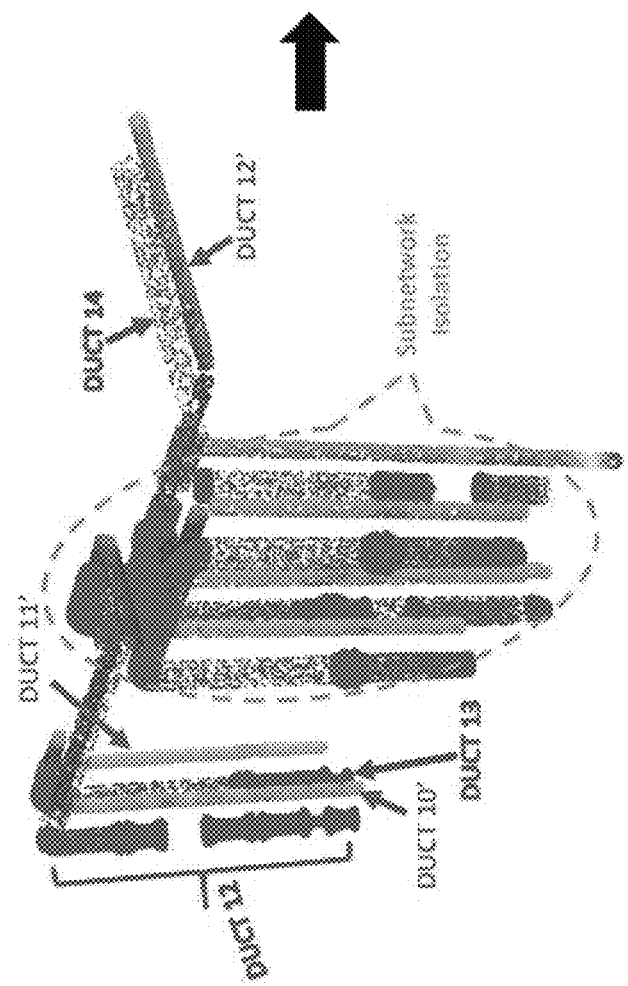
FIG. 4A

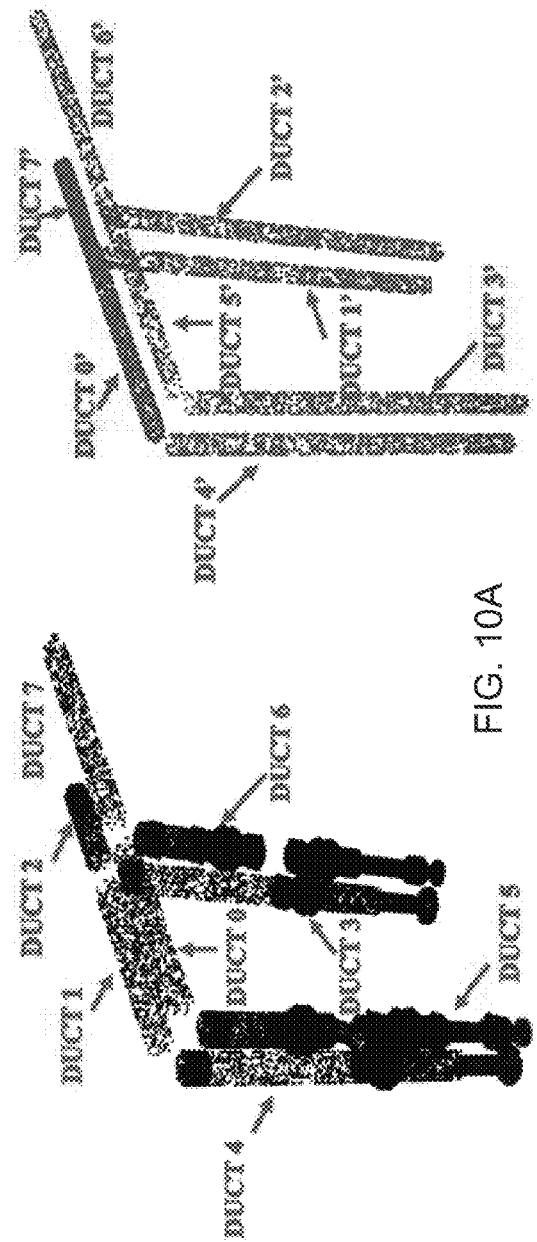
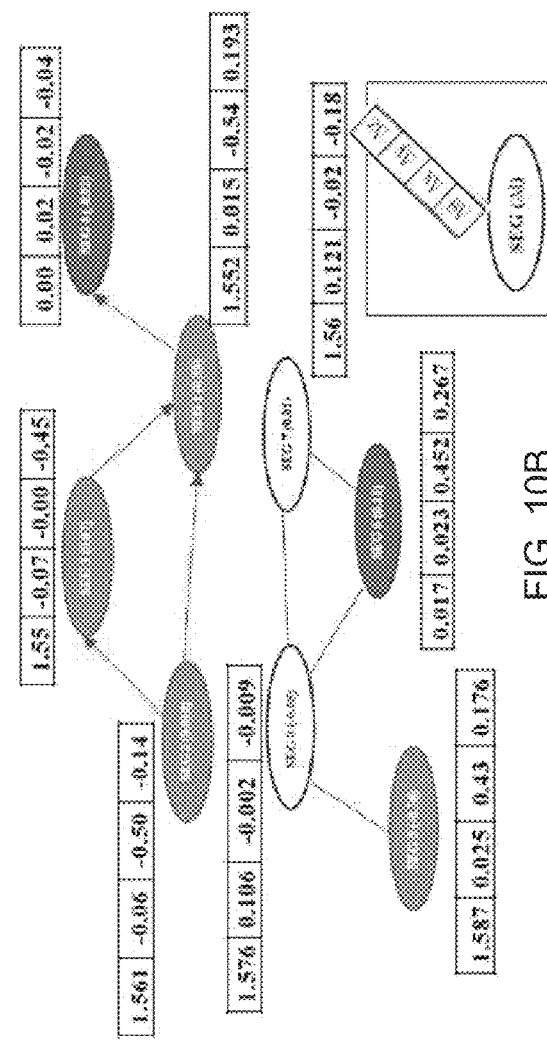
FIG. 10A
FIG. 10B

SYSTEMS AND METHODS FOR AUTOMATED SPATIAL CHANGE DETECTION AND CONTROL OF BUILDINGS AND CONSTRUCTION SITES USING THREE-DIMENSIONAL LASER SCANNING DATA

CROSS REFERENCE TO RELATED APPLICATIONS

This is a non-provisional application that claims benefit to U.S. provisional application Ser. No. 62/327,930, filed on Apr. 26, 2016, which is herein incorporated by reference in its entirety.

GOVERNMENT SUPPORT

This invention was made with government support under 1454654 awarded by the National Science Foundation. The government has certain rights in the invention.

FIELD

The present disclosure generally relates to automated spatial change detection and control of buildings and construction sites, and in particular to systems and methods for automated spatial change detection and control of buildings and construction sites using three-dimensional laser scanning data.

BACKGROUND

Frequent changes in construction projects pose challenges to design-construction collaboration due to cascading interactions between design changes and field adjustments. Incomplete design information, improper field operations, and unexpected site conditions may result in deviations between as-designed and as-built conditions of building components, which may lead to misalignments between components. Also, such changes may propagate along networks of building elements (e.g. ductworks), and cause cascading effects that are difficult to track. The propagation of design-built deviations among building elements usually requires a significant amount of change coordination efforts among multiple stakeholders. Improper change management could cause reworks, wastes, delays during construction while increasing construction costs. Furthermore, poor change coordination may also create interruptions in decision-making processes during Operations and Maintenance (O&M) phase. O&M planning can become challenging if detailed changes between as-built and as-designed conditions and information about how spatial changes propagate along the spatial and temporal domains are missing. Construction engineers, therefore, have to analyze design changes and field adjustments causing design-built differences and find ways to control the impacts of such changes on project performance.

Recent technological advancements, such as Building Information Modeling (BIM), enabled construction engineers and managers to coordinate design and construction activities of multiple trades involved in a project. Commercial BIM software facilitates the visualization of building elements including Mechanical, Electrical, and Plumbing (MEP) systems for coordination purposes so that potential clashes among building elements can be resolved virtually before constructability problems occur on site. Some BIM tools support the comparison of multiple versions of as-designed models to detect changes between versions and record design change histories for change management. However, manual updates of as-designed BIM could be error-prone and may miss certain spatial changes occurring in the field. As a result, only using design-oriented BIM tools could hardly track differences between as-designed and as-built conditions.

Several researchers explored the potential of using three-dimensional (3D) imaging technologies, namely 3D laser scanning and photogrammetry coupled with computer vision, for change analysis between as-designed and as-built conditions. 3D laser scanning is an emerging technology that can capture very accurate as-built geometries promptly. Data produced by 3D laser scanners is in the form of dense 3D point clouds. Such point clouds can be used to detect differences between as-designed models and as-built conditions. However, associating objects from the as-designed model with points in point clouds in an efficient and reliable manner is challenging, especially when spatial changes occur. Tang et al. identified the challenges associated with detecting and classifying spatial changes during design and construction processes. That study concluded that a robust spatial change detection and classification approach would enable reliable automatic diagnosis of the propagative effects of changes that cause reworks and construction quality problems. Recent studies have explored the application of relational graphs to match and compare objects from 3D as-designed models with the objects in the corresponding 3D as-built model accurately, which has significant advantages over data-model comparison tools that are available in commercial 3D data processing and reverse engineering environments, such as InnovMetric Polyworks. However, comparing relational graphs generated from as-designed models and 3D laser scan data of large-scale building systems (e.g., hundreds of interconnected duct-works) involves computational complexity that grows exponentially with the number of building elements.

BIM technology addresses the difficulties associated with design change coordination by enabling synchronization of multiple trade design models in a central BIM for clash detection and coordination. Langroodi & Staub-French conducted a case study to exploit the benefits of using BIM for design change management of a fast-track project. Akinci and Boukamp concluded that BIM can document different design alterations, but could hardly address the propagative impacts of changes that collectively influence the construction quality, cost, and productivity. Also, BIM tools mainly focus on design change coordination, while engineers are required to update as-designed BIM manually according to the as-built conditions to analyze the impact of field changes on the project performance. This practice is tedious and error-prone.

Previous studies focused on automated modeling of as-built pipelines from laser scan data for construction quality assessment and monitoring purposes. Construction project managers would use these as-built models to investigate any dimensional deviations between the individual objects of the as-built and as-designed models. Several studies investigated the integrated use of 3D imaging technologies and BIM for detecting and analyzing spatial changes that occur in the field. Tang et al. reviewed a broad range of algorithms and techniques that are used for the recognition and reconstruction of building elements from 3D laser scan data for as-built modeling. Based on this review, Xiong et al. developed methods that automatically create semantically rich BIM from 3D laser scan data using voxel representation to make the as-designed and as-built BIM comparison more efficient. Similar concepts inspired a study that developed an approach for automated spatial change analysis of linear building elements. Bosche developed a robust point matching method for as-built dimension calculation and control of 3D CAD model objects recognized in laser scans. Based on this work, Turkan et al. developed an automated progress monitoring system that combines 4D BIM and 3D laser scan data for change detection and management. Nahangi and Haas developed an automated deviation detection approach for pipe spools based on scan-to-BIM registration. This study employed an automated registration step for quantifying the deviations in the defective parts of the pipe spool assemblies. Bosche et al. coupled Scan-versus-BIM, and Scan-to-BIM approaches to track and diagnose changes of densely packed cylindrical MEP (Mechanical, Electrical, and Plumbing) elements.

The majority of the studies described above utilizes nearest-neighbor searching algorithms for detecting spatial deviations and changes between as-designed and as-built conditions and thus inherit the limitations of this algorithm. In many cases, especially when several similar objects packed in small spaces (e.g., several ducts packed in a mechanical room), the change detection results of nearest neighbor searching may contain mismatches that associate data points with the wrong objects in the as-designed model. As a result, the change analysis and progress monitoring results would be misleading.

Manual comparison of 2D and 3D imagery data against as-designed models is also tedious and error-prone. The majority of the previous change detection studies relied on the "nearest-neighbor searching" paradigm to associate the as-designed model with as-built data. The nearest neighbor searching approach associates each point in a 3D laser scan data with an as-designed model object that is the "nearest neighbor." In other words, the algorithm considers that each as-built data point in the 3D laser scan data belongs to the object that is in its neighborhood, and the algorithm takes the closest object as the object that corresponds to these points. The nearest neighbor search algorithm then calculates the distances between the corresponding as-designed model objects and as-built data points, and visualize these distances using a color-coded "deviation map." Such a deviation map highlights the parts that data points are deviating away from their nearest as-designed model objects. Nevertheless, the nearest neighbor searching approach has several limitations that may lead to data-model mismatches. More specifically, nearest neighbor searching could fail to provide reliable results when associating a large number of similar and small objects packed in relatively small spaces, such as mechanical rooms of large facilities. FIG. 1 provides an example to illustrate these limitations. In this case, the ducts in as-built data are associated with the wrong ducts in the as-designed model because of the misalignment between the ducts in the as-designed model and as-built model. This observation indicates that the nearest neighbor searching algorithm failed to accurately associate ducts that were subjected to changes between the as-built and as-designed models.

Another algorithm matches "spatial contexts" of building components, e.g. ducts, captured in as-designed and as-built models to achieve more reliable association between as-designed model and as-built data. The algorithm first constructs "relational graphs" that depict spatial relationships between objects extracted from as-designed models or as-built models created based on 3D laser scan data. More specifically, a relational graph is a network representation of the objects in a model, in which the nodes represent the objects and the edges connecting them represent spatial relationships between objects (FIG. 2). Each node can have attributes to describe the properties of the object, called "local attributes" (e.g., shape, size, or color). The spatial relationships of an object with other objects represent the "spatial context" of that object. After obtaining two relational graphs that respectively represent the as-designed model and the as-built model, the algorithm matches these two relational graphs and associate as-designed objects with as-built model elements (e.g., surfaces and lines extracted from laser scan data) based on the similarity of their attributes and spatial contexts. These two studies showed that this relational-graph-based approach could achieve automatic and reliable change detection of relatively small ductworks (<20 ducts) in a mechanical room.

These two studies described above used cases that involve tens of ducts to validate the relational-graph-based approach. Unfortunately, the computational complexity of extracting and matching relational graphs from large datasets increase exponentially with the number of objects in the as-designed and as-built models. A step forward is thus improving the computational efficiency of the relational-graph-based approach.

It is with these observations in mind, among others, that various aspects of the present disclosure were conceived and developed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 4A-4C is an illustration showing nearest neighbor matching between an as-designed model and an as-built model, according to one aspect of the present disclosure;

FIG. 10A is an illustration showing subnetwork 1 and FIG. 10B is an illustration showing a tolerance network, according to one aspect of the present disclosure.

Corresponding reference characters indicate corresponding elements among the view of the drawings. The headings used in the figures do not limit the scope of the claims.

DETAILED DESCRIPTION

Design changes have various impacts on the quality and performance of a construction project. Poor communication among different trades and poor documentation practices lead to design changes and rework during construction. In current practice, design changes are documented as "Change Orders" as per the procedures defined by the American Institute of Architects (AIA). Architects follow these guidelines and manually log all the design change orders, which is time-consuming and error-prone.

Methodology

Figure 1:
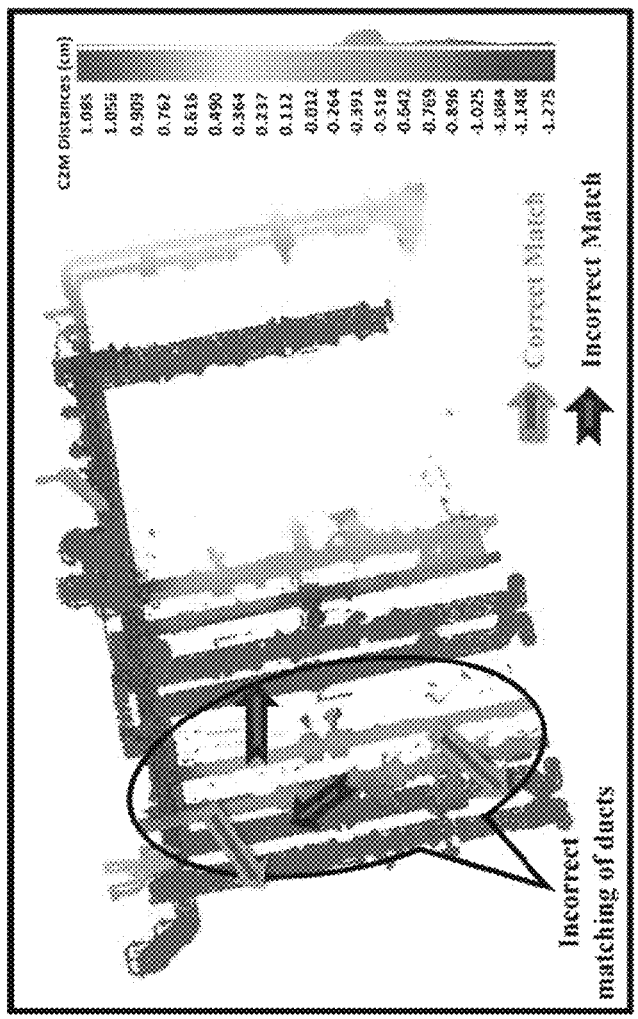
FIG. 1 is an illustration of results for the nearest neighbor searching algorithm having incorrect matching of ducts, according to one aspect of the present disclosure.
Figure 1:
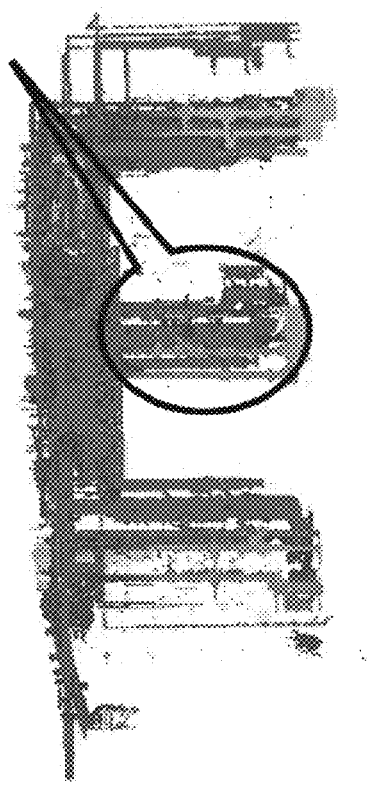
Figure 2:
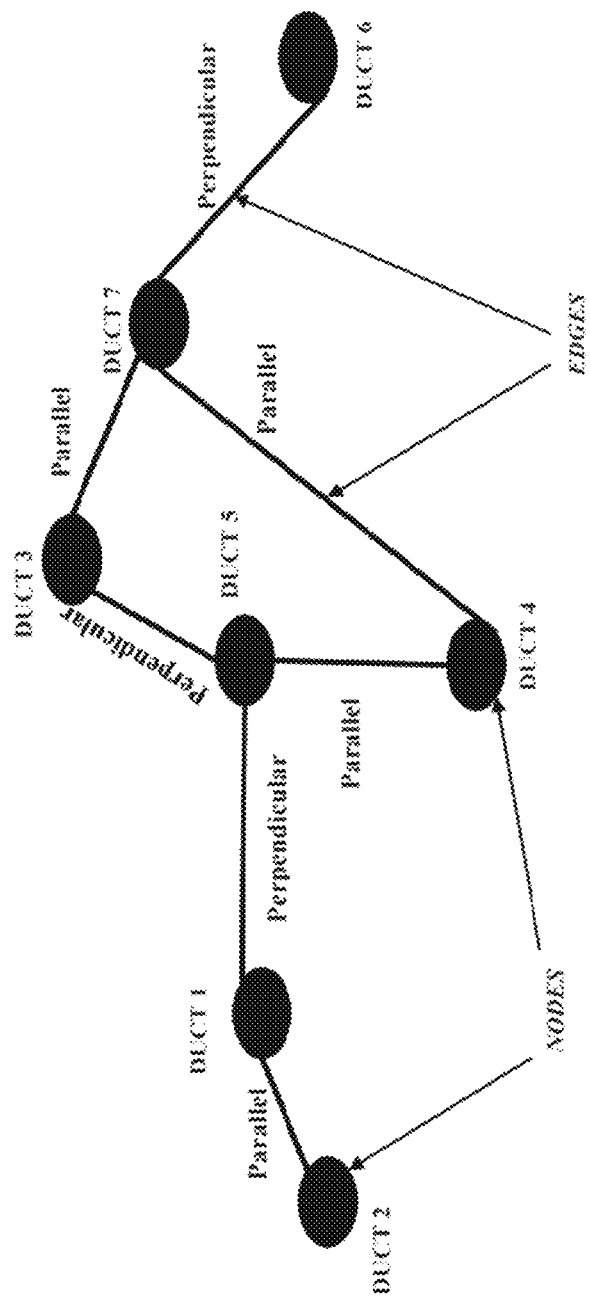
FIG. 2 is a simplified illustration showing an example of a relational graph network, according to one aspect of the present disclosure.
Figure 3:
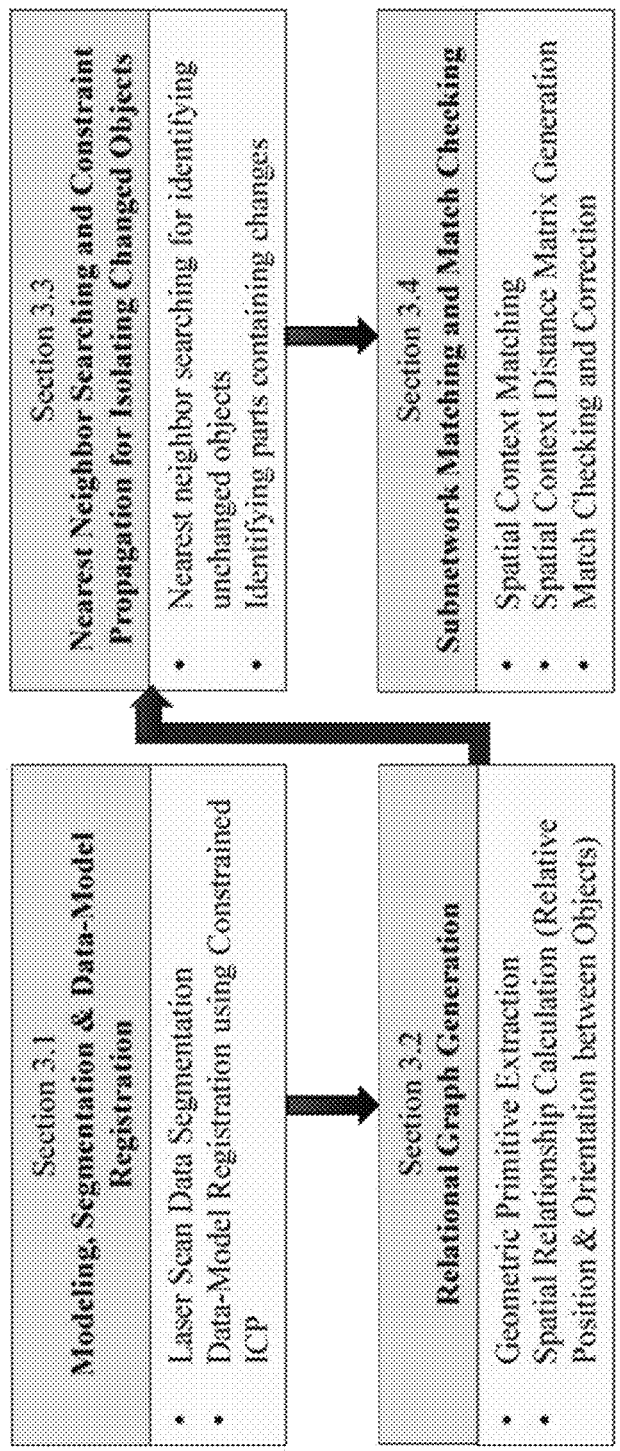
FIG. 3 is an illustration showing a framework for change detection between an as-designed model and an as-build model, according to one aspect of the present disclosure.

The improvement of the present system for a relational-graph-based approach integrates nearest neighbor searching and the relational-graph-based matching approaches to achieve a computationally efficient change detection for large as-designed models and as-built laser scan data of building systems composed of hundreds of elements (e.g., ductworks). FIG. 3 presents four steps of the new method: 1) modeling, segmentation, and data-model registration, 2) relational graph generation, 3) nearest neighborhood searching and constraint propagation for isolating subnetworks that contain significant changes or deviations, and 4) subnetwork matching using spatial contexts and match checking, as detailed below.

Modeling, Segmentation, and Data-Model Registration

This step involves preprocessing of 3D laser scan data to remove redundant information and segments out relevant data for reliable change detection. Commercially available software tools for 3D laser scan data processing, such as Leica Geosystems HDS™ Cyclone, 3DReshaper, and ClearEdge3D EdgeWise™, include segmentation and modeling tools. In this study, the inventors used Clear Edge's EdgeWise 3D Plant Suite™ software to extract 3D objects (e.g., ducts) from 3D laser scan data. This process is referred to as Scan-to-BIM, where the final product is a 3D as-built model. Clear Edge's Edgewise 3D Plant™ software considers occlusions when implementing cylinder-fitting algorithms for extracting ducts from 3D laser scan data. The testing results confirmed that the cylinder fitting algorithm implemented in Clear Edge's Edgewise 3D Plant™ software can accurately extract cylindrical ducts from 3D laser scan data even if only partial surfaces of the cylindrical shapes are scanned. Such occlusion-tolerant algorithms ensure that the axes of ducts used for change analysis between the as-designed and as-built ductworks are reliable. Next, the inventors align the as-designed model against the as-built model using a Constrained Iterative Closest Point (ICP) registration technique so that to bring the as-designed and as-built models to the same coordinate system. This process requires users to first manually align larger ducts with a radius larger than 0.1 meters between the as-designed and as-built models, and then apply the constrained ICP algorithm by utilizing a maximum distance value of 0.3 meters. This "maximum distance" value of 0.3 m means that the registration algorithm would not search corresponding objects beyond a neighborhood of 0.3 m (a sphere with a radius of 0.3 for searching corresponding objects). Narrowing the closest point search in such a 0.3 m spherical neighborhood ignores the parts of the model with significant deviations for improved computational efficiency. This data-model registration is a preparation necessary for the following data-model comparison that integrates the nearest neighbor searching and relational graph matching.

Relational Graph Generation

This step aims at automatically extracting local attributes of objects (e.g., lengths and radii of duct sections) and spatial relationship between objects for generating relational graphs based on the as-designed model and the as-built model created based on laser scan data. Algorithm 1 first detects the attributes of all objects present in both models, and then automatically generates relational graphs for both models by computing spatial relationships between objects. Algorithm 1 below shows the pseudo code of this relational graph generation process.

| Algorithm 1: Pseudo Code for Relational Graph Generation |
| --- |
| 1. //Sampled duct components of As-designed model |
| 2.    for each sampled as-designed duct |
| 3.       Use Principle Component Analysis to extract line segments (best fit) |
| 4.       Calculate the line segment's center point P(x,y,z) |
| 5.       Calculate the relative positions & orientations between the extracted line segments |
| 6.    end |
| 7. //Sampled duct components of As-built model |
| 8.    for each sampled as-built model duct |
| 9.       Use Principle Component Analysis to extract line segments (best fit) |
| 10.      Calculate the line segment's center point P'(x,y,z) |
| 11.      Calculate the relative positions & orientations between the extracted line segments |
| 12.   end |

To generate the nodes and edges of relational graphs, algorithm 1 requires the geometric representations of all objects present in both the as-designed and as-built models. The focus of this study is change detection of cylindrical ductworks packed in relatively small mechanical rooms so that the authors focus on the geometric representations of ductworks. Specifically, the inventors used "Line" as a geometric primitive to represent cylindrical ducts present in the as-designed and as-built models. The developed algorithm 1 thus needs to automatically extract the axes of the cylindrical duct sections in the as-designed and as-built models and represents them as lines to generate the relational graphs. Because the geometric representation of duct sections in as-designed and as-built models are surfaces of cylindrical objects, the extraction of axes of cylinders need to implement a method for fitting lines based on the surface geometry. The inventors' implementation is to use the "sample points on mesh" tool of the CloudCompare™ software to uniformly sample points on the surfaces of as-designed and as-built model objects. That process converts surfaces of objects into point clouds. The Principle Component Analysis (PCA) method then extracts lines from the 3D points sampled on surfaces of duct sections. FIGS. 4A-4C show an example of sampled as-designed model ducts (Red). Algorithm 1 then detects changes between the as-designed/as-built lines extracted from the uniformly sampled as-designed/as-built point clouds. In the past, researchers found that fitting geometric primitives against 3D point cloud data with varying data densities will produce geometric primitives that are distorted towards parts having higher data densities. Therefore, using resampled point clouds will avoid inaccurate geometric primitives extracted from raw point clouds that have varying data densities.

In the modeling step, the inventors focused on modeling the straight duct sections from the as-designed and as-built models, because analyzing the changes of those sections can serve as a major step forward to further analysis of joints and valves. More specifically, matching lines (straight duct sections) between the models pave the path toward automatically recognizing the connections between those lines (e.g., elbows, joints) and matching the as-designed and as-built objects relevant to those connections (valves installed on those connected parts). Keeping the cylindrical ducts as the focus in this disclosure, the number of points required for identifying cylindrical duct sections is set to be 100 pts per square meter. The inventors conducted experiments on 3D imagery data used in this research and found that using this threshold could successfully eliminate elbow connections, valves, and tee joints between ducts while keeping straight sections of ducts in both the as-designed and as-built models. This process of modeling (Scan-to-BIM) and uniform sampling is robust when extracting straight cylindrical duct sections even if the duct is occluded in the 3D laser scan data. The next step is to extract the best-fit line (geometric primitive) of straight cylindrical duct sections using the PCA algorithm and then generate the relational graph.

Given relational graphs that represent the spatial relationships between duct sections (lines), the relational-graph-generation algorithm finally generates a spatial context for each line or each duct section in both the as-designed and as-built models. Algorithm 1 automatically uses the position and orientation information of lines to calculate the relative position (e.g., above, below, left, right) and orientation (e.g., parallel, perpendicular) between lines and the spatial contexts of lines. A spatial context of a line represents how many lines are above, below, to the left/right, parallel with and perpendicular to that line. These spatial contexts would play critical roles in the step of relational graph matching presented later.

Nearest Neighbor Searching and Constraint Propagation for Isolating Changed Parts The generated relational graphs provide a basis for the detection of differences between the as-designed and as-built models. In the change detection step, algorithm 1 first uses the nearest neighbor searching to associate the objects (ducts) that did not have significant deviations between the as-designed and as-built models. Algorithm 1 then follows a hierarchical process to isolate parts of the ductworks that have significant deviations and apply computationally expensive but reliable relational graph matching. Such a hierarchical process reduces the amount of computation by first establishing most of the data-model associations through the rapid nearest neighbor search, leaving the context matching on smaller parts of the large network of ductworks.

Algorithm 2 below shows the pseudo codes of this process. In Algorithm 2, i represents the i-th as-designed line, and j represents the j-th as-built line; diff_distance (i,j) represents the distance between center points of lines i and j; diff_orientation (i,j) stands for the dot-product of the orientation vectors of lines i and j (i.e., 1 means that two lines are parallel). CM is the Correlation Matrix that indicates the association between as-designed and as-built lines—if CM(i,j) equals to 1, then the i-th as-designed line is corresponding to the j-th as-built line, while 0 represents no association. Table 1 shows an example of a correlation matrix presenting the matching results of the as-designed and as-built models shown in FIGS. 4A-4C.

---

Algorithm 2: Pseudo Code for Change Detection using the nearest neighbor searching 1. Define diff_distance (i,j)=zeros; (i is the i-th as-designed line, j is the j-th as-built line)
2. Define diff_orientation (i,j)=zeros; (i is the i-th as-designed line, j is the j-th as-built line)
3. Define CM(i,j)=zeros; (Correlation matrix between diff_distance and diff_orientation)
4. for each ducts center point from both as-designed model and as-built model
5.    Calculate the distance "D" between each pair i,j's center points and store it in diff_distance(i,j)
6.    Calculate the dot product between each i,j's line segments and store it in diff_orientation(i,j)
7.    if diff_distance(i,j) <0.15 && diff_orientation ==1
8.      CM(i,j) ==1
9.    else
10.      CM(i,j) ==0
11.    end
end)

---

TABLE 1

Correlation matrix for subnetwork 1 ("1" means a match, "0" means no match)

| As-Designed/As-Built | DUCT 0' | DUCT 1' | DUCT 2' | DUCT 3' | DUCT 4' | DUCT 5' | DUCT 6' | DUCT 7' | DUCT 8' | DUCT 9' | DUCT 10' | DUCT 11' | DUCT 12' |
|---|---|---|---|---|---|---|---|---|---|---|---|---|---|
| DUCT 0 | 1 | 1 | 1 | 0 | 1 | 0 | 0 | 1 | 0 | 0 | 0 | 0 | 0 |
| DUCT 1 | 0 | 0 | 0 | 1 | 0 | 0 | 0 | 0 | 1 | 0 | 0 | 0 | 0 |
| DUCT 2 | 0 | 0 | 0 | 0 | 0 | 0 | 1 | 0 | 0 | 1 | 0 | 0 | 0 |
| DUCT 3 | 0 | 0 | 0 | 1 | 0 | 1 | 0 | 0 | 1 | 0 | 0 | 0 | 0 |
| DUCT 4 | 0 | 0 | 0 | 0 | 1 | 0 | 0 | 0 | 0 | 0 | 0 | 0 | 0 |
| DUCT 5 | 1 | 0 | 0 | 0 | 0 | 0 | 0 | 1 | 0 | 0 | 0 | 0 | 0 |
| DUCT 6 | 0 | 0 | 1 | 0 | 0 | 0 | 0 | 0 | 0 | 0 | 0 | 0 | 0 |
| DUCT 7 | 0 | 1 | 0 | 0 | 1 | 0 | 0 | 0 | 0 | 0 | 0 | 0 | 0 |
| DUCT 8 | 0 | 0 | 0 | 0 | 0 | 0 | 0 | 0 | 0 | 0 | 0 | 0 | 0 |
| DUCT 9 | 0 | 0 | 0 | 0 | 0 | 1 | 0 | 0 | 1 | 0 | 0 | 0 | 0 |
| DUCT 10 | 0 | 0 | 0 | 0 | 0 | 0 | 1 | 0 | 0 | 1 | 0 | 0 | 0 |
| DUCT 11 | 1 | 0 | 1 | 0 | 0 | 0 | 0 | 1 | 0 | 0 | 0 | 0 | 0 |
| DUCT 12 | 0 | 0 | 0 | 0 | 0 | 0 | 0 | 0 | 0 | 0 | 1 | 0 | 0 |
| DUCT 13 | 0 | 0 | 0 | 0 | 0 | 0 | 0 | 0 | 0 | 0 | 1 | 1 | 0 |
| DUCT 14 | 0 | 0 | 0 | 0 | 0 | 0 | 0 | 0 | 0 | 0 | 0 | 0 | 1 |

In Algorithm 2, the algorithm first eliminates parts of the ductworks that have no significant deviations based on the deviation map produced by the nearest neighbor searching process. The remaining parts would then contain large deviations and be much smaller than the complete duct network for carrying out computationally expensive relational graph matching process. Algorithm 2 first uses the relative position and orientation of the lines (duct sections) to associate duct sections that have similar locations and orientations. Specifically, algorithm 2 calculates the center of each extracted line from the as-designed model and the as-built model, and determines that two lines must be corresponding lines in the as-designed and as-built models based on two conditions: 1) the distance between the two lines' center points are less than 0.15 m, and 2) the two lines are parallel with each other. The authors found that this 0.15 m threshold could effectively identify most pairs of lines that have less or no changes between as-designed and as-built models. FIGS. 4A-4C show an example of an as-designed model (red) and its corresponding as-built model (blue). In FIGS. 4A-4C, the distance between the centers of the line (duct) 14 (as-designed) and line 12' (duct) (as-built) is within 0.15 m, and they are parallel with each other. Thus the algorithm associates these two lines (Table 1).

The nearest neighbor searching step matches most of the duct sections that do not change in the as-designed and as-built models and assign "1"s to the elements of the Correlation Matrix to indicate these matches. On the other hand, such simple nearest neighbor and orientation checking have the following limitations: 1) if the models consist of duct sections packed in small spaces, algorithm 2 will associate multiple as-designed ducts within 0.15 m with a single as-built duct while only one of these as-designed ducts is the correct match, and vice versa; 2) if significant changes occurred during construction, the nearest neighbor searching can't automatically associate as-designed and as-built objects that move out of the neighborhood due to changes; 3) if the occlusions in the as-built model split a duct into multiple sections and cause significant dislocations of the center points of duct sections, which would not be within 0.15 m of any as-designed ducts and thus remain unmatched; 4) if a change causes an as-built duct occupy the same space of an as-designed duct that is actually not corresponding to the as-built duct, the algorithm incorrectly associates these two ducts. The following paragraphs will introduce new techniques that could resolve these limitations based on spatial relationship and context information available in relational graphs.

A "constraint propagation" step can overcome the first limitation of the nearest neighbor searching process. For example, in FIG. 4A, the as-designed duct 13 is the nearest neighbor to both as-built duct 10' and duct 11'. The correlation matrix indicates that duct 13 in the as-designed model matches with both duct 10' and duct 11' in the as-built model (Table 1). The constraint propagation process found that duct 10' is the only match of duct 12, so it applies constraint propagation to resolve the ambiguous match between duct 10' and duct 13 (Highlighted in Table 1) and determines that duct 13 should be paired with duct 11'. Such sequential matching eliminates multiple associations and increases the accuracy of matching. After executing the nearest neighbor searching and constraint propagations, the correlation matrix still has unmatched ducts or incorrect matches. FIG. 4A clearly shows that few ducts (dash line) are close to each other, where the nearest neighbor matching fails and leave certain lines as "unmatched." Once algorithm 2 identifies these matched and unmatched lines, it automatically isolates smaller subnetworks that contain unmatched lines (FIGS. 4B and 4C) breaks from the entire relational graph. Such subnetwork isolation utilizes the results of the nearest neighbor searching and constraint propagation along with the connectivity information between the adjacent ducts. Specifically, the unmatched Duct 4 in the as-designed model is connected to an unmatched Duct 3 and a matched Duct 12. Since Duct 12 is matched using both the nearest neighbor searching and the constraint propagation, the algorithm will use the connection between Duct 4 and Duct 12 to isolate the sub-network (FIG. 4B-Highlighted in Black). Similarly, the subnetwork isolation approach identified the connection between the unmatched Duct 8 and matched Duct 14 to identify interconnected unmatched ducts (FIG. 4B-Highlighted in Black). Using this subnetwork isolation approach, the algorithm isolated Ducts 0-11 in the as-designed model and Ducts 0'-9' in the as-built model (FIGS. 4B and 4C) for further spatial context matching, as detailed in the next subsection.

Subnetwork Matching Using Spatial Contexts, and Match Checking

Figure 5B:
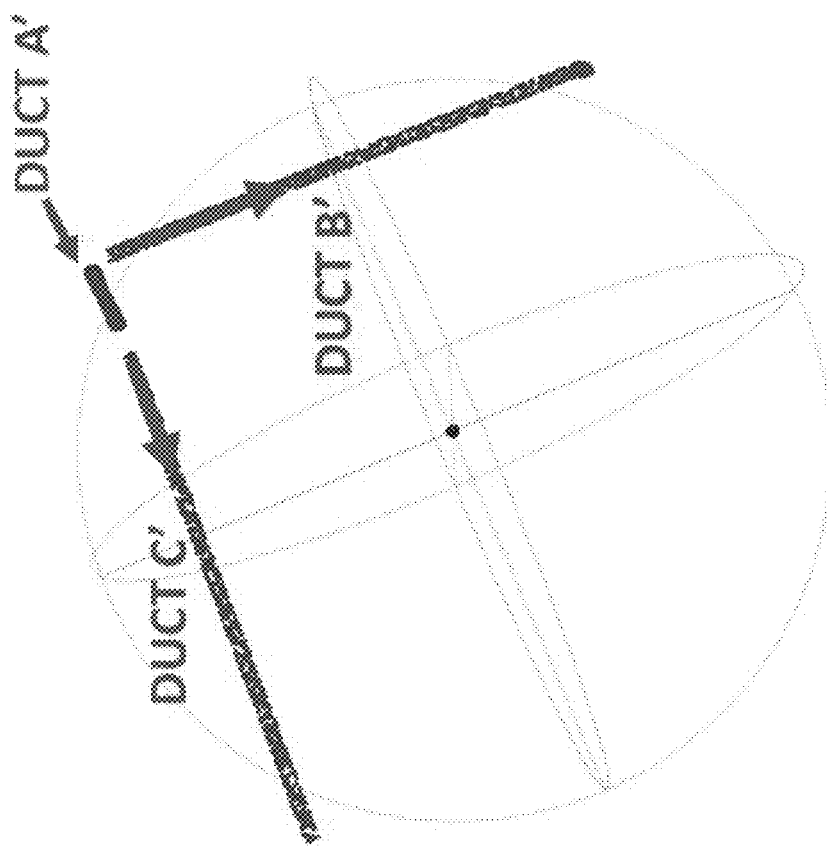
FIG. 5A is an illustration showing as-designed model ducts and FIG. 5B is an illustration showing as-built model ducts, according to one aspect of the present disclosure.
Figure 5A:
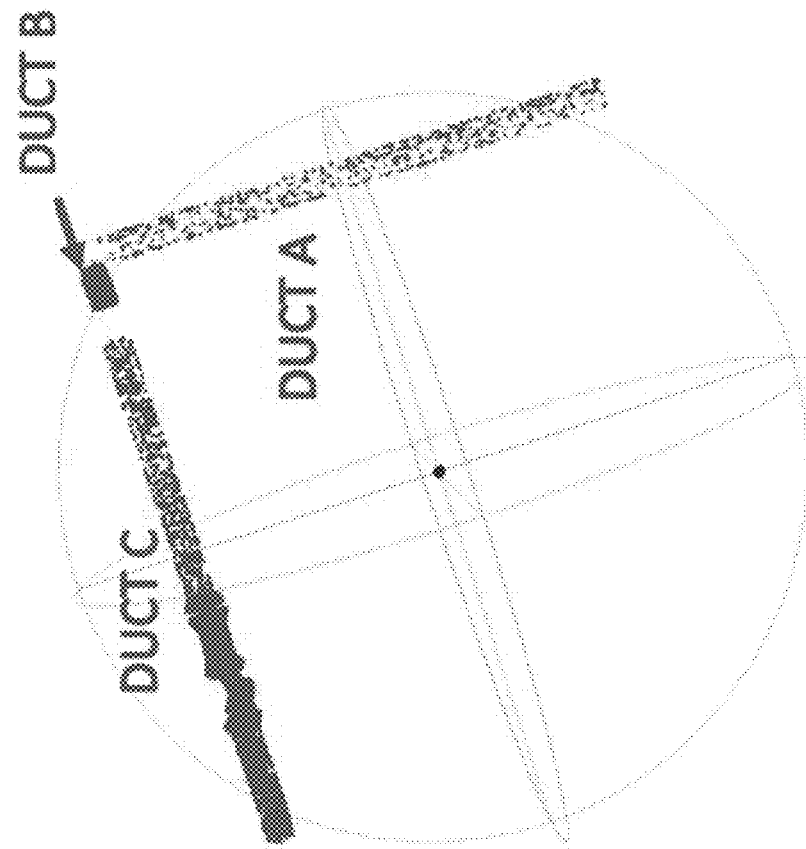

A combined use of connectivity information that indicates the adjacent ducts through connections and spatial contexts of ducts that indicate relative position and orientation between ducts can help address the second limitation of nearest neighbor searching—the difficulty in associating changed ducts in the as-designed and as-built models. The developed algorithm 2 first detects areas that have interconnected unmatched ducts (lines). Algorithm 2 then either traces the connected ducts or identifies ducts with similar spatial contexts to associate unmatched as-built ducts with their likely correspondents in the as-designed model. FIGS. 5A and 5B shows an example of tracing connected ducts for identifying corresponding ducts between the as-designed and as-built models. In this case, a subnetwork contains three connected ducts. The nearest neighbor matching process associated duct C (as-designed) with duct C' (as-built), and duct A (as-designed) with duct B' (as-built). Duct A' in the as-built model is short but still twice longer than its corresponding as-designed object (duct B); so that the nearest neighbor matching could not match these two short ducts. The connection tracking method can associate duct B with duct A' through the check of the connections with ducts already matched—two adjacent ducts both have known matches in the as-built model, then duct B should be duct A', which connect the two matched as-built ducts. More generally, the connection tracking algorithm can grow the network of matched ducts (along the red arrows in FIG. 5B) through connections for identifying more matches until filling unmatched "gaps" between matched ducts.

---

Algorithm 3: Pseudo Code for Subnetwork Matching using spatial context

1. // For each duct in the Subnetwork (As-designed model and As-built Model)
2. Define $r_{fnt}$, $l_{fnt}$, $r_{bk}$, $l_{bk}$ (Initial Value=0)
3. for each Unmatched duct's center point
    4. if Difference between the x-coordinate of an as-designed line
    and an as-built line >0
        5. if Two lines are parallel
        6.    $l_{fnt} = l_{fnt} + 1$
        7. else
        8.    $r_{fnt} = r_{fnt} + 1$
        9. end
    10. end
    11. if Difference between the x-coordinate of an as-designed Algorithm 3: Pseudo Code for Subnetwork Matching using spatial context

```
       line and an as-built line <0
            12.   if Two lines are parallel
            13.      l_bk = l_bk + 1
            14.   else
            15.      r_bk = r_bk +1
            16.   end
            17.  end
       18. end
       19. //Repeat the above loop for y, z coordinates of the line's (As-
              designed and as-built models) center points by defining r_rt, l_rt, r_lft,
              l_lft, r_ab, l_ab, r_blw, l_blw
       20.   // Generate "Spatial Context Matrix" for each line (duct) using all
              the variables defined above.
       21.   // Find the absolute sum of differences between spatial context
              matrix of each line (duct) from the as-built model to each line
              (duct) from the as-designed model.
       22.   // Generate the spatial context distance matrix.
       23.   //Use the least distance value to match corresponding ducts
              from the as-built model with ducts from the as-designed model.
```

Algorithm 3 generates a "local" spatial context for each duct in the isolated parts of duct networks that undergo significant changes between their as-designed and as-built models. Such isolated parts of ducts are "subnetworks" of larger duct networks of the as-designed and as-built model. A "local" spatial context represents the relative spatial locations and orientations of a duct with respect to other ducts in the subnetwork that contains the considered duct. Table 2 formally defines the concept of local spatial context—every row represents the relative positions of the considered duct with respect to other ducts in the subnetwork along the X, Y, and Z-axes. Here "r" represents the number of lines perpendicular to it; "l" represents the number of lines parallel to it. Along the x-axis, "fnt" means front, "bk" means back. Along the y-axis, "rt" means to the right, "lft" means to the left. Along the z-axis, "ab" means above, and "blw" represents below the corresponding duct. Therefore, "lfnt" stands for the number of ducts in front of and parallel to the considered duct.

TABLE 2

Spatial Context matrix

| Axis | Spatial Context | | | |
|---|---|---|---|---|
| x | $r_{fnt}$ | $l_{fnt}$ | $r_{bk}$ | $l_{bk}$ |
| y | $r_{rt}$ | $l_{rt}$ | $r_{lft}$ | $l_{lft}$ |
| z | $r_{ab}$ | $l_{ab}$ | $r_{blw}$ | $l_{blw}$ |

$$Dij = \text{Sum}(|C_{ii} - C'_{ii}|)$$

The spatial context matching process calculates the spatial context distance between two ducts and identifies as-designed and as-built ducts that have the most similar spatial contexts as matches. The spatial context distance is the absolute sum of the differences between the local spatial context matrices of the as-designed duct (C) and the as-built duct (C'), as shown in Equation 1. The spatial context matching process associates all remaining unmatched ducts in the as-built model with ducts in the as-designed model that have the most similar spatial contexts as theirs. The distances between the local spatial contexts are elements in a "spatial context distance matrix." In a spatial context distance matrix, the rows represent the ducts from the as-designed model, and the columns represent the ducts from the as-built model. The matrix elements contain values of the spatial context distances between the corresponding pairs of as-designed and as-built ducts. Table 3 presents the spatial context distance matrix generated for the isolated subnetworks case shown in FIGS. 4A-4C. This table indicates that the local spatial context matching approach can achieve a reliable match in certain cases. For example, ducts 4, 6, and 8 from the as-designed model are correctly associated with one duct in the as-built model (duct 4'). The spatial context matching can handle such "n to one" matching cases. Actually, for the case shown in FIGS. 4A-4C, the spatial context matching correctly associate all ten as-built ducts with the corresponding as-designed ducts, while the nearest neighbor searching could only correctly match eight of these ten ducts.

TABLE 3

Spatial context distance matrix generated for ducts shown in FIG. 4

| As-Designed/As-Built | DUCT 0' | DUCT 1' | DUCT 2' | DUCT 3' | DUCT 4' | DUCT 5' | DUCT 6' | DUCT 7' | DUCT 8' | DUCT 9' |
|---|---|---|---|---|---|---|---|---|---|---|
| DUCT 0  | 12 | 24 | 19 | 18 | 20 | 16 | 16 | 8  | 13 | 10 |
| DUCT 1  | 28 | 16 | 14 | 4  | 18 | 21 | 18 | 16 | 24 | 20 |
| DUCT 2  | 20 | 12 | 15 | 19 | 19 | 36 | 7  | 18 | 36 | 24 |
| DUCT 3  | 12 | 20 | 24 | 13 | 29 | 33 | 19 | 19 | 5  | 16 |
| DUCT 4  | 13 | 28 | 24 | 16 | 6  | 23 | 30 | 26 | 33 | 12 |
| DUCT 5  | 6  | 20 | 14 | 28 | 27 | 27 | 23 | 21 | 24 | 20 |
| DUCT 6  | 24 | 13 | 14 | 20 | 9  | 19 | 22 | 22 | 14 | 28 |
| DUCT 7  | 18 | 2  | 19 | 24 | 36 | 18 | 19 | 12 | 14 | 24 |
| DUCT 8  | 15 | 19 | 18 | 16 | 7  | 16 | 18 | 20 | 19 | 24 |
| DUCT 9  | 13 | 14 | 20 | 9  | 19 | 3  | 16 | 19 | 13 | 14 |
| DUCT 10 | 10 | 16 | 36 | 18 | 10 | 24 | 28 | 22 | 10 | 4  |
| DUCT 11 | 24 | 20 | 10 | 20 | 24 | 20 | 20 | 29 | 24 | 19 |

Above discussions indicate that a combined use of connection tracing and spatial context matching can address the second limitation of the nearest neighbor searching (cannot establish reliable matches between as-designed and as-built ducts when significant changes occur). Overall, algorithm 2 matches using the nearest neighbor searching in which the results from algorithm 2 assist to isolate and classify subnetworks. In addition, subnetworks of ducts are classified into two categories: Category 1—subnetworks that have three or less connected ducts, and category 2—subnetworks that have more than three connected ducts. Once the algorithm extracts all subnetworks containing unmatched ducts between the as-designed and as-built model, it separates them into these two categories. Algorithm 2 shows the matching nearest neighbor searching for growing subnetworks falling into category 1 for filling the unmatched duct sections between matched parts of the duct network. When the subnetwork has more than three ducts and becomes a category 2 subnetwork, algorithm 2 will apply the local spatial context matching for achieving more reliable matching. The last two limitations of the nearest neighbor searching described at the beginning of this subsection causes mismatches—those ducts that are matched in the nearest neighbor searching step could be wrong. An addition step of match checking is thus necessary for correcting such nearest neighbor mismatches. Such a match-checking step traces the connections between ducts available in the as-designed and as-built models for verifying the consistency of the matching results. For example, when two connected as-designed ducts are matched with two as-built ducts that are not connected the algorithm 2 will detect that inconsistency, and trigger a back-tracking of the connection relationships for correcting the mismatch.

Performance Metrics and Comparative Analysis of Algorithms for Change Detection

The fast and computationally efficient change detection approach presented in this disclosure accurately associates the as-designed and as-built model objects, as discussed above. Based on previous studies of assessing the performance of change detection algorithms, the inventors have validated the performance of the system presented in this disclosure against the nearest neighbor searching approach (NN approach hereafter) and a spatial-context matching approach (SC approach hereafter) presented herein. In this comparative analysis of the three change detection approaches, the inventors use the amount of computation time and precision as two metrics to compare the performance of these three algorithms. The computation time only includes the time after the data-model registration step because all three compared approaches use the same data-model registration step and the critical performance difference between these algorithms lie in the steps related to data-model matching. Equation 2 defines the metric of precision.

$$\text{Precision } (P) = \frac{\text{Number of Correctly Matched Ducts}}{\text{Total Number of Modeled As-Built Ducts}} \quad (2)$$

The precision refers to the percentage of correctly matched as-built ducts in this study. The authors manually associated as-built ducts with as-designed ducts to create the ground truth necessary for calculating the "number of correctly matched ducts" and derive the precision of matching between as-built and as-designed models.

Processing System

Figure 11:
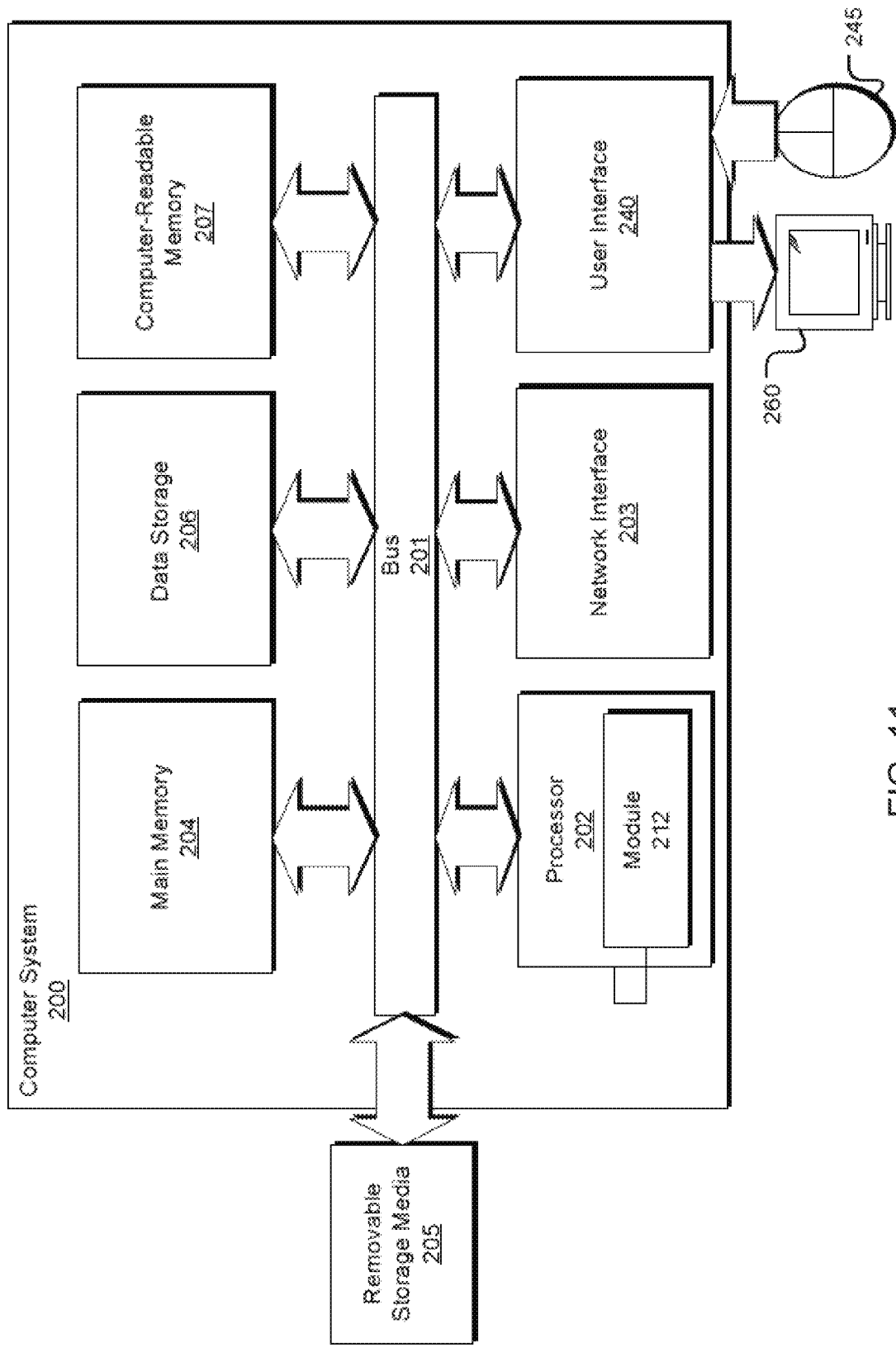
FIG. 11 is a simplified block diagram showing that illustrates the hardware and software components of an automated spatial change detection and control system, according to one aspect of the present disclosure.

FIG. 11 illustrates an example of a suitable computing and networking environment used to implement various aspects of the present disclosure. Example embodiments described herein may be implemented at least in part in electronic circuitry; in computer hardware executing firmware and/or software instructions; and/or in combinations thereof. Example embodiments also may be implemented using a computer program product (e.g., a computer program tangibly or non-transitorily embodied in a machine-readable medium and including instructions for execution by, or to control the operation of, a data processing apparatus, such as, for example, one or more programmable processors or computers). A computer program may be written in any form of programming language, including compiled or interpreted languages, and may be deployed in any form, including as a stand-alone program or as a subroutine or other unit suitable for use in a computing environment. Also, a computer program can be deployed to be executed on one computer, or to be executed on multiple computers at one site or distributed across multiple sites and interconnected by a communication network.

Certain embodiments are described herein as including one or more modules. Such modules are hardware-implemented, and thus include at least one tangible unit capable of performing certain operations and may be configured or arranged in a certain manner. For example, a hardware-implemented module may comprise dedicated circuitry that is permanently configured (e.g., as a special-purpose processor, such as a field-programmable gate array (FPGA) or an application-specific integrated circuit (ASIC)) to perform certain operations. A hardware-implemented module may also comprise programmable circuitry (e.g., as encompassed within a general-purpose processor or other programmable processor) that is temporarily configured by software or firmware to perform certain operations. In some example embodiments, one or more computer systems (e.g., a stand-alone system, a client and/or server computer system, or a peer-to-peer computer system) or one or more processors may be configured by software (e.g., an application or application portion) as a hardware-implemented module that operates to perform certain operations as described herein.

Accordingly, the term "hardware-implemented module" encompasses a tangible entity, be that an entity that is physically constructed, permanently configured (e.g., hardwired), or temporarily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules 212 at different times. Software may accordingly configure a processor 202, for example, to constitute a particular hardware-implemented module at one instance of time and to constitute a different hardware-implemented module at a different instance of time.

Hardware-implemented modules 212 may provide information to, and/or receive information from, other hardware-implemented modules 212. Accordingly, the described hardware-implemented modules 212 may be regarded as being communicatively coupled. Where multiple of such hardware-implemented modules 212 exist contemporaneously, communications may be achieved through signal transmission (e.g., over appropriate circuits and buses) that connect the hardware-implemented modules. In embodiments in which multiple hardware-implemented modules 212 are configured or instantiated at different times, communications between such hardware-implemented modules may be achieved, for example, through the storage and retrieval of information in memory structures to which the multiple hardware-implemented modules 212 have access. For example, one hardware-implemented module 212 may perform an operation, and may store the output of that operation in a memory device to which it is communicatively coupled. A further hardware-implemented module 212 may then, at a later time, access the memory device to retrieve and process the stored output. Hardware-implemented modules 212 may also initiate communications with input or output devices.

As illustrated, the computing and networking environment 200 may be a general purpose computing device 200, although it is contemplated that the networking environment 200 may include other computing systems, such as personal computers, server computers, hand-held or laptop devices, tablet devices, multiprocessor systems, microprocessor-based systems, set top boxes, programmable consumer electronic devices, network PCs, minicomputers, mainframe computers, digital signal processors, state machines, logic circuitries, distributed computing environments that include any of the above computing systems or devices, and the like.

Components of the general purpose computing device 200 may include various hardware components, such as a processing unit 202, a main memory 204 (e.g., a system memory), and a system bus 201 that couples various system components of the general purpose computing device 200 to the processing unit 202. The system bus 201 may be any of several types of bus structures including a memory bus or memory controller, a peripheral bus, and a local bus using any of a variety of bus architectures. For example, such architectures may include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The general purpose computing device 200 may further include a variety of computer-readable media 207 that includes removable/non-removable media and volatile/non-volatile media, but excludes transitory propagated signals. Computer-readable media 207 may also include computer storage media and communication media. Computer storage media includes removable/non-removable media and volatile/nonvolatile media implemented in any method or technology for storage of information, such as computer-readable instructions, data structures, program modules or other data, such as RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information/data and which may be accessed by the general purpose computing device 200. Communication media includes computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. For example, communication media may include wired media such as a wired network or direct-wired connection and wireless media such as acoustic, RF, infrared, and/or other wireless media, or some combination thereof. Computer-readable media may be embodied as a computer program product, such as software stored on computer storage media.

The main memory 204 includes computer storage media in the form of volatile/nonvolatile memory such as read only memory (ROM) and random access memory (RAM). A basic input/output system (BIOS), containing the basic routines that help to transfer information between elements within the general purpose computing device 200 (e.g., during start-up) is typically stored in ROM. RAM typically contains data and/or program modules that are immediately accessible to and/or presently being operated on by processing unit 202. For example, in one embodiment, data storage 206 holds an operating system, application programs, and other program modules and program data.

Data storage 206 may also include other removable/non-removable, volatile/nonvolatile computer storage media. For example, data storage 206 may be: a hard disk drive that reads from or writes to non-removable, nonvolatile magnetic media; a magnetic disk drive that reads from or writes to a removable, nonvolatile magnetic disk; and/or an optical disk drive that reads from or writes to a removable, nonvolatile optical disk such as a CD-ROM or other optical media. Other removable/non-removable, volatile/nonvolatile computer storage media may include magnetic tape cassettes, flash memory cards, digital versatile disks, digital video tape, solid state RAM, solid state ROM, and the like. The drives and their associated computer storage media provide storage of computer-readable instructions, data structures, program modules and other data for the general purpose computing device 200.

A user may enter commands and information through a user interface 240 or other input devices 245 such as a tablet, electronic digitizer, a microphone, keyboard, and/or pointing device, commonly referred to as mouse, trackball or touch pad. Other input devices 245 may include a joystick, game pad, satellite dish, scanner, or the like. Additionally, voice inputs, gesture inputs (e.g., via hands or fingers), or other natural user interfaces may also be used with the appropriate input devices, such as a microphone, camera, tablet, touch pad, glove, or other sensor. These and other input devices 245 are often connected to the processing unit 202 through a user interface 240 that is coupled to the system bus 201, but may be connected by other interface and bus structures, such as a parallel port, game port or a universal serial bus (USB). A monitor 260 or other type of display device is also connected to the system bus 201 via user interface 240, such as a video interface. The monitor 260 may also be integrated with a touch-screen panel or the like.

The general purpose computing device 200 may operate in a networked or cloud-computing environment using logical connections of a network Interface 203 to one or more remote devices, such as a remote computer. The remote computer may be a personal computer, a server, a router, a network PC, a peer device or other common network node, and typically includes many or all of the elements described above relative to the general purpose computing device 200. The logical connection may include one or more local area networks (LAN) and one or more wide area networks (WAN), but may also include other networks. Such networking environments are commonplace in offices, enterprise-wide computer networks, intranets and the Internet.

When used in a networked or cloud-computing environment, the general purpose computing device 200 may be connected to a public and/or private network through the network interface 203. In such embodiments, a modem or other means for establishing communications over the network is connected to the system bus 201 via the network interface 203 or other appropriate mechanism. A wireless networking component including an interface and antenna may be coupled through a suitable device such as an access point or peer computer to a network. In a networked environment, program modules depicted relative to the general purpose computing device 200, or portions thereof, may be stored in the remote memory storage device.

Validation and Results

Experiment Design

Figure 6B:
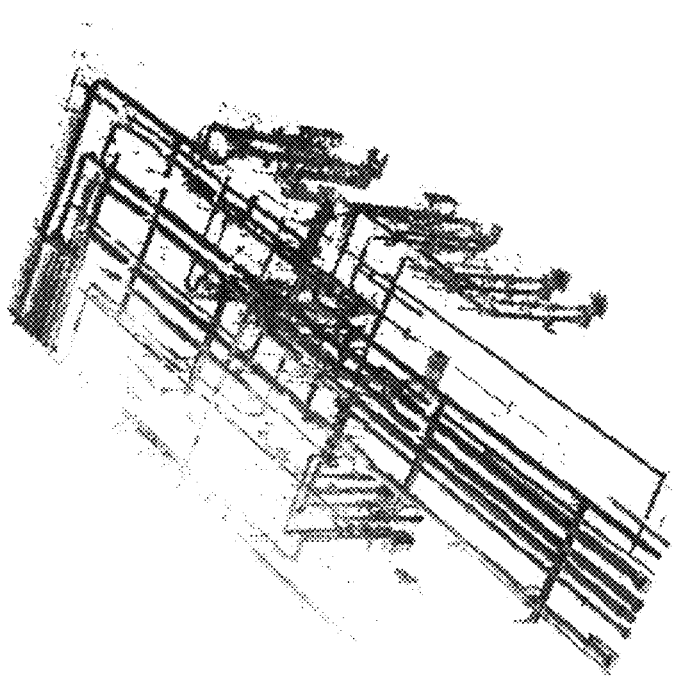
FIG. 6A is an illustration showing an as-designed model and FIG. 6B is an illustration showing a 3D laser scan data, according to one aspect of the present disclosure.
Figure 6A:
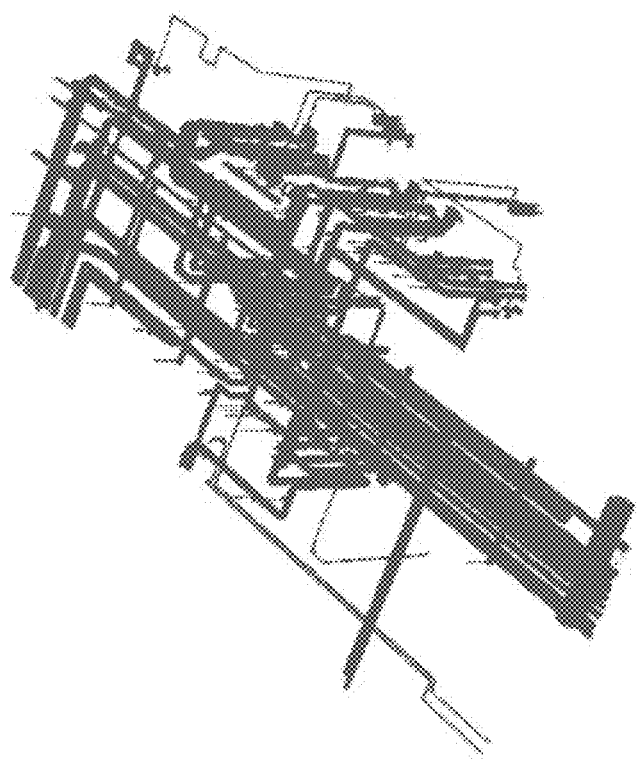

To validate the proposed approach, the inventors collected as-designed information and as-built data of an educational building located at Iowa State University campus. The building is a four-story structure with 16,260 square meter space. The experiment conducted here was focused on the mechanical room of the building. The general contractor of the project provided the as-designed model of the mechanical room, while the inventors collected the as-built data using a Trimble® TX5 phase-based laser scanner. FIGS. 6A and 6B present the 3D laser scan data of the mechanical room as well as its corresponding up-to-date BIM, which was updated multiple times during construction due to design changes.

Figure 7B:
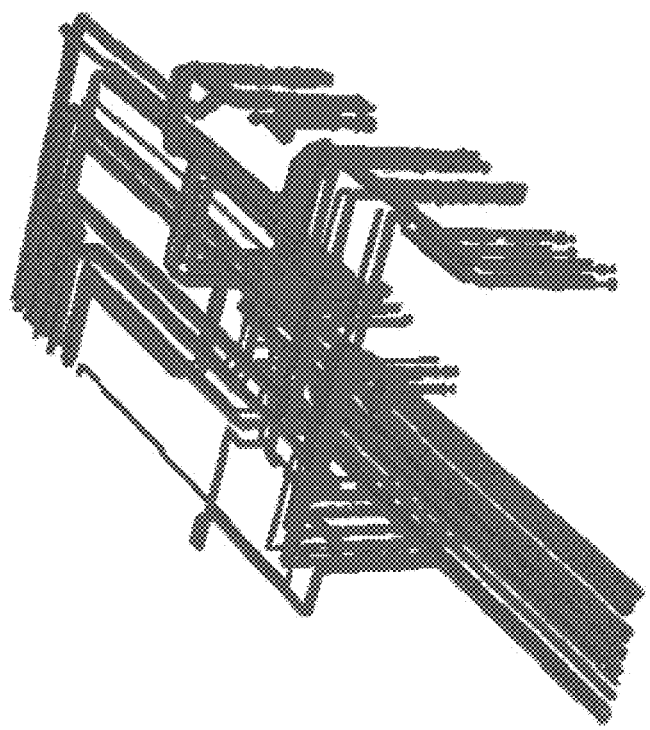
FIG. 7A is an illustration showing an as-built model and FIG. 7B is an illustration showing a registered as-designed model and an as-built model, according to one aspect of the present disclosure.
Figure 7A:
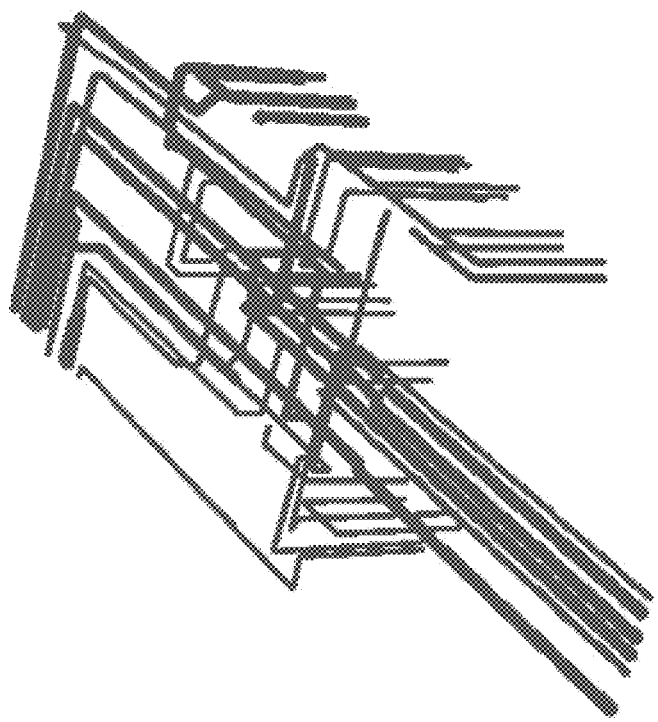

The four-step process presented in the methodology section was applied to the dataset described above to match the ducts captured in the as-designed model and the 3D laser scan data. The first step is to use the ClearEdge3D™ point cloud processing software to extract ducts present in the laser scan data. The software roughly aligned the design model and as-built data and was able to detect 66% (109 out of 165) of the as-designed ducts that were visible in the 3D laser scan data (FIGS. 7A and 7B). The validation experiments presented below thus use that 109 ducts for comparing the data-model matching the performance of the method presented in this paper (NN+SC method) against the nearest neighbor searching (NN method) and spatial context matching (SC method) methods examined in previous studies.

Experiment Results

Figure 8:
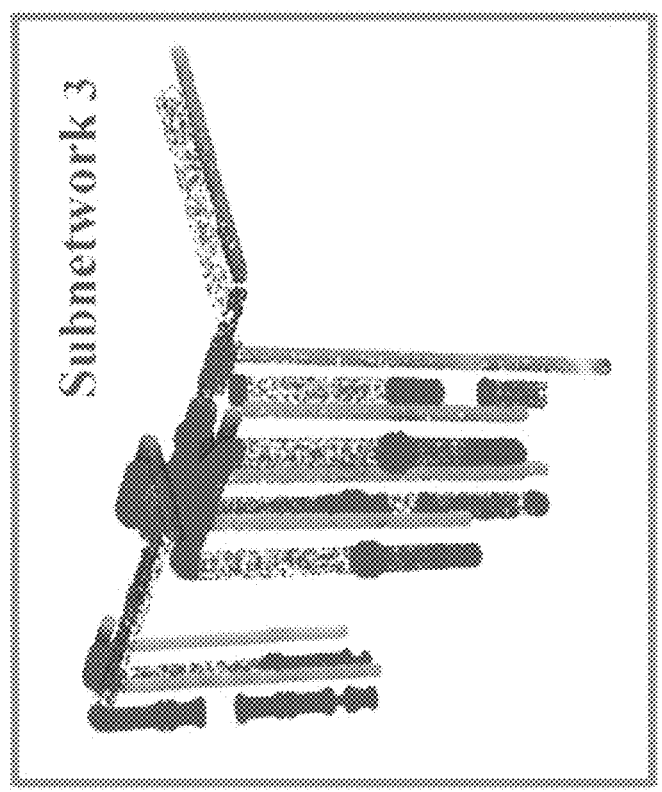
FIG. 8 is an illustration showing areas with large deviations, according to one aspect of the present disclosure.
Figure 8:
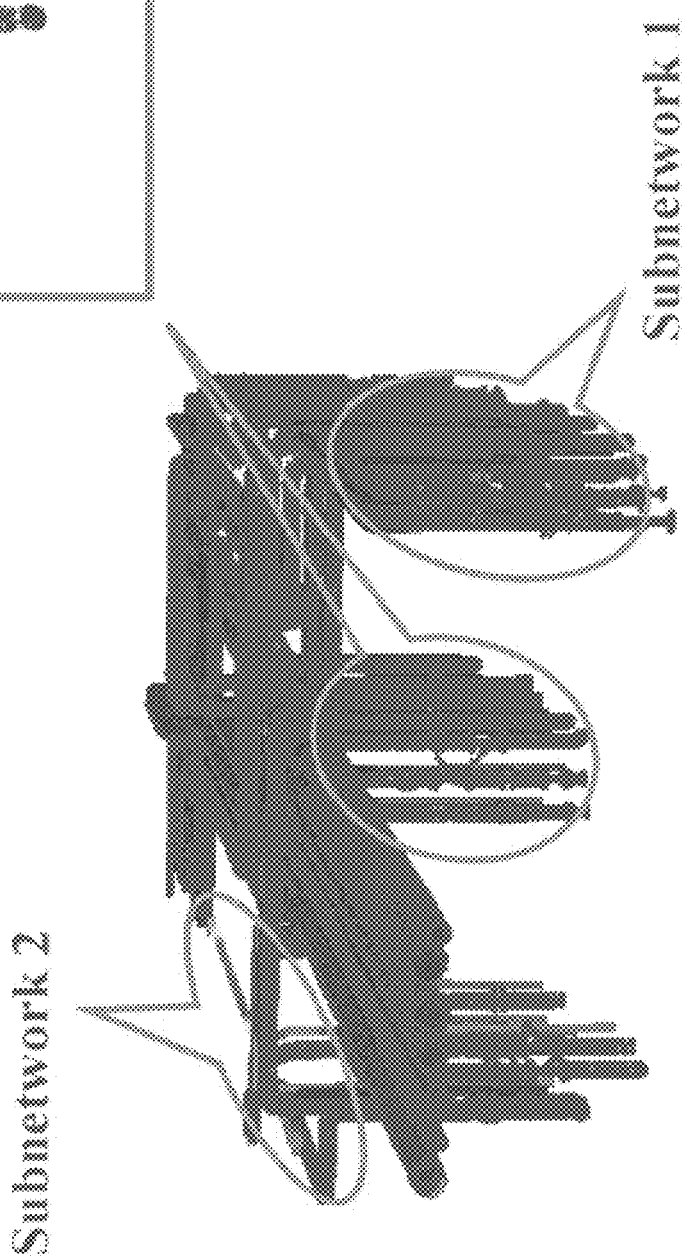

Upon completion of the as-built modeling process, the nearest neighbor searching and the constraint propagation algorithms were able to detect deviations between the as-designed and as-built models. In the test case, the nearest neighbor searching and constraint propagation algorithms matched (77%) 84 out of 109 of the ducts between two models while detecting and isolating ducts with large deviations between the as-designed and as-built models. FIG. 8 shows areas of duct network having large deviations (Major isolated subnetworks). Table 4 lists all subnetworks isolated for this test case.

TABLE 4

Subnetworks Isolated by the Nearest Neighbor Searching and Constraint Propagation Process

| Subnetwork | No. of ducts in the subnetwork (As-Designed model) | No. of ducts in the subnetwork (As-Built model) |
|---|---|---|
| Subnetwork 1 | 8 | 8 |
| Subnetwork 2 | 6 | 6 |
| Subnetwork 3 | 12 | 10 |
| Subnetwork 4 | 5 | 5 |
| Subnetwork 5 | 4 | 4 |
| Subnetwork 6 | 3 | 3 |
| Subnetwork 7 | 3 | 3 |

Comparison of the Developed Algorithm with NN and SC Methods

Figures 9A, 9B:
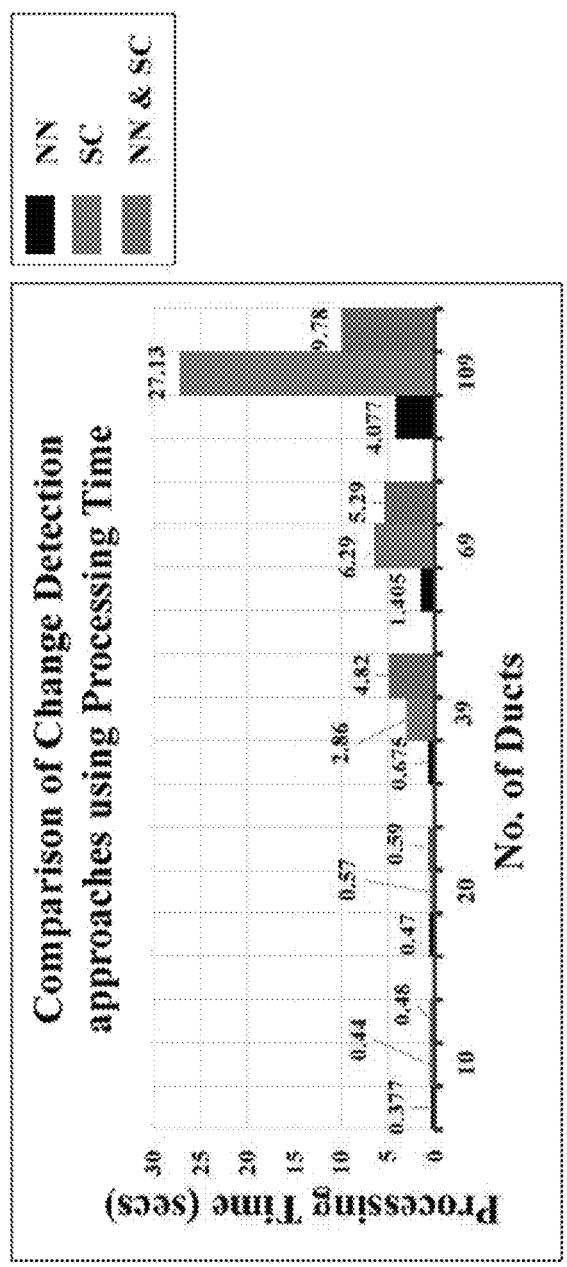
FIG. 9A is a graphical representation showing a comparison of changer detection approaches using processing time and FIG. 9B is a graphical representation of changer detection approaches using matching precision, according to one aspect of the present disclosure.

FIGS. 9A and 9B provide a comparison between the algorithms in terms of processing time and precision; where "NN" is the nearest neighbor searching approach, while "SC" is the spatial context algorithm, and "NN&SC" refers to the algorithm proposed in this study. To ensure the generality of the comparative performance analysis of these algorithms, the inventors conducted a set of experiments using 10, 20, 39, 69, and 109 ducts respectively. The experimental results shown in FIGS. 9A and 9B indicate that the proposed NN&SC algorithm is more precise compared to NN and SC algorithms. FIGS. 9A and 9B show that when the number of ducts increases, the processing time required for matching using NN algorithm increases while the precision decreases significantly. On the other hand, the processing time required for matching using NN&SC algorithm increases but not exponentially while maintaining the precision of matching.

Discussion and Direction for Future Research

Extension of the presented new change detection algorithm could enable some domain applications that require a fast and reliable comparison between as-designed and as-built conditions. At the same time, the algorithm itself does have a few aspects that deserve further investigation. The paragraphs below present how the presented relational-graph-based approach enables real-time constructability analysis of installing prefabricated building components in accelerated construction projects and discusses a few other issues of the algorithm that deserve further studies.

Fast and reliable detection of design changes could help detect "fit-up" issues (miss-alignment between components) during the accelerated construction process. Prefabrication of building components has become popular in recent years and shows the potentials in improving the overall construction workflow. However, current methods for monitoring dimensional and installation errors of prefabricated components can hardly capture how those errors accumulate in the field and result in misalignment. As a result, engineers lack tools for real-time control of the error accumulation in the field. As detailed below, an extension of the proposed change detection approach could generate tolerance networks to assist with prefabricated components' installation process to avoid "fit-up" problems.

A comparison of the relational graphs generated from the as-designed and as-built models could help identify manufacturing and installation errors for each component involved in the accelerated construction process. Those errors of components could form into "tolerance network" that is useful for predicting how errors interact with each other and accumulate into misalignments. A tolerance network analysis could help engineers in identifying strategies in adjusting installation processes for minimizing the impacts of the manufacturing and installation errors of prefabricated components. FIG. 10B shows an example of a tolerance network that shows dimensional errors on the nodes that represent building elements (e.g., SEGMENT of ducts, "SEG" in the figure), and shows the rotation and displacement errors of joints between building elements. Specifically, $\Delta O$ represents the deviation of a joint from its as-designed orientation, while $\Delta x$, $\Delta y$, and $\Delta z$ represents the dislocation of joint from its as-designed location. Given fabrication errors of all connected components and errors at the connections between building elements, this tolerance network can predict how those errors accumulate into misalignment between building elements and predict how engineers could adjust position and rotation parameters during installation for alleviating misalignments.

FIG. 10B is the tolerate network generated for the data and model shown in FIG. 10A (Subnetwork 1 discussed in the previous section). Eight nodes in FIG. 10A represent the eight as-designed ducts in this case. Each node contains a Δl to indicate the prefabrication error that causes the deviation of the length of a duct from its as-designed length. Each edge linking two nodes contains four numbers (ΔO, Δx, Δy, Δz) that indicate the deviations of the joint between the two ducts from its original orientations and locations. Observing the fabrication errors and joint errors in FIGS. 10A and 10B, one could identify a "flow" of errors that originates from section 2 (SEG 2) and ends at section 4 (SEG 4).

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A method for automated spatial change detection for a construction site, the method comprising:
    obtaining an as-designed model of the construction site;
    receiving three-dimensional scan data of the construction site, the construction site having a network of a plurality of elements;
    generating an as-built model of the construction site from the three-dimensional scan data, the as-designed model and the as-built model each including a plurality of three-dimensional objects corresponding to the plurality of elements;
    aligning the as-designed model with the as-built model;
    generating a relational graph for each of the as-designed model and the as-built model by detecting one or more local attributes of the three-dimensional objects present in both the as-designed model and the as-built model and computing a spatial relationship between the three-dimensional objects;
    determining a deviation between the as-built model and the as-designed model in the relational graphs for each of the three-dimensional objects;
    eliminating any of the three-dimensional objects with the deviation below a threshold using nearest neighbor searching;
    isolating any of the three-dimensional objects with the deviation above the threshold using context matching;
    generating a local spatial context for each of the isolated three-dimensional objects; and
    associating any unmatched objects in the as-built model with corresponding objects in the as-designed model using the local spatial context.

2. The method of claim 1, wherein the network is a ductworks with the plurality elements each being a cylindrical duct.

3. The method of claim 1, wherein the as-designed model is aligned with the as-built model using a constrained iterative closest point registration within a maximum distance value, any portions of the as-designed model, and the as-built model outside the maximum distance value being removed.

4. The method of claim 3, wherein the maximum distance value is 0.3 m.

5. The method of claim 1, wherein the relational graphs are each generated by automatically extracting axes of the three-dimensional objects and generating line representations using the axes, the relational graphs each including a relative orientation and position and a spatial context of each of the line representations.

6. The method of claim 5, wherein the line representations are each generated by extracting a line segment using a principle component analysis and calculating a center point of the line segment.

7. The method of claim 1, wherein the threshold is 0.15 m.

8. The method of claim 1, wherein the nearest neighbor searching identifies matched line representations and unmatched line representations of the three-dimensional objects between the as-built model and the as-designed model.

9. The method of claim 8, wherein the isolated three-dimensional objects include the unmatched line representations.

10. A method for automated spatial change detection for a construction site, the method comprising:
    obtaining an as-designed model of the construction site;
    receiving three-dimensional scan data of the construction site, the construction site having a network of a plurality of elements;
    generating an as-built model of the construction site from the three-dimensional scan data, the as-designed model and the as-built model each including a plurality of three-dimensional objects corresponding to the plurality of elements;
    generating a first relational graph for the as-designed model;
    generating a second relational graph for the as-built model;
    eliminating any subnetworks of one or more matched objects between the as-built model and the as-designed model, the one or more matched objects having a deviation between the first relational graph and the second relational graph below a threshold;
    extracting any subnetworks of one or more unmatched objects between the as-built model and the as-designed model, the one or more unmatched objects having a deviation between the first relational graph and the second relational graph below the threshold;
    separating the subnetworks of one or more unmatched objects into a first category and a second category;
    filling the one or more unmatched objects in the first category between a subset of the one or more matched objects using connection tracking; and
    matching the one or more unmatched objects in the second category using local spatial context.

11. The method of claim 10, wherein the network is a ductworks with the plurality of elements each being a cylindrical duct.

12. The method of claim 10, wherein the threshold is 0.15 m.

13. The method of claim 10, wherein the first and second relational graphs are each generated by automatically extracting axes of the three-dimensional objects and generating line representations using the axes, the first and second relational graphs each including a relative orientation and position and a spatial context of each of the line representations.

14. The method of claim 10, wherein the as-built model is aligned with the as-designed model.

15. The method of claim 14, wherein the as-designed model is aligned with the as-built model using a constrained iterative closest point registration within a maximum distance value, any portions of the as-designed model and the as-built model outside the maximum distance value being removed.

16. The method of claim 10, wherein the first category includes the subnetworks having three or fewer connected three-dimensional objects and the second category includes the subnetworks having more than three connected three-dimensional objects.

17. A method for automated spatial change detection for a construction site, the method comprising:
    obtaining an as-designed model and an as-built model of the construction site having a network of a plurality of elements, the as-designed model and the as-built model each including a plurality of three-dimensional objects corresponding to the plurality of elements, the three-dimensional objects segmented through registration of the as-built model with the as-designed model within a maximum distance value;
    generating a first relational graph for the as-designed model;
    generating a second relational graph for the as-built model;
    isolating one or more subnetworks of the three-dimensional objects having a deviation between the first relational graph and the second relational graph above a threshold; and
    matching each of the three-dimensional objects in the one or more isolated subnetworks using at least one of connection tracking or local spatial context.

18. The method of claim 17, wherein the one or more subnetworks are isolated based on nearest neighbor searching and constraint propagation.

* * * * *